(12) United States Patent
Laven

(10) Patent No.: US 11,081,481 B2
(45) Date of Patent: Aug. 3, 2021

(54) SEMICONDUCTOR DEVICE WITH AN IGBT REGION AND A NON-SWITCHABLE DIODE REGION

(71) Applicant: Infineon Technologies AG, Neubiberg (DE)

(72) Inventor: Johannes Georg Laven, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/683,383

(22) Filed: Nov. 14, 2019

(65) Prior Publication Data
US 2020/0083216 A1 Mar. 12, 2020

Related U.S. Application Data

(62) Division of application No. 15/856,406, filed on Dec. 28, 2017, now abandoned.

(30) Foreign Application Priority Data

Dec. 29, 2016 (DE) .......................... 102016125879.2

(51) Int. Cl.
*H01L 27/06* (2006.01)
*H01L 29/10* (2006.01)
(Continued)

(52) U.S. Cl.
CPC ...... *H01L 27/0635* (2013.01); *H01L 27/0727* (2013.01); *H01L 29/0688* (2013.01);
(Continued)

(58) Field of Classification Search
CPC ............. H01L 27/0635; H01L 29/0834; H01L 27/0727; H01L 29/1095; H01L 29/0688;
(Continued)

(56) References Cited

U.S. PATENT DOCUMENTS 9,966,461 B2   5/2018 Pfirsch et al.
2003/0116807 A1* 6/2003 Matsuda ............. H01L 29/0696
                                                     257/370
(Continued)

FOREIGN PATENT DOCUMENTS

DE    102015111371 A1    1/2017

*Primary Examiner* — Bitew A Dinke
(74) *Attorney, Agent, or Firm* — Murphy, Bilak & Homiller, PLLC

(57) ABSTRACT

A semiconductor device includes a semiconductor substrate having a body layer arranged between a front side and a drift layer, and forming a pn-junction with the drift layer. A front metallization is on the front side in Ohmic connection with the body layer, and a back metallization opposite is in Ohmic connection with the drift layer. An IGBT cell region of the device includes a plurality of gate electrodes in Ohmic connection with a gate metallization. Each gate electrode is electrically insulated from the semiconductor substrate by a respective gate dielectric extending through the body layer. A free-wheeling diode region of the device includes a plurality of field electrodes in Ohmic connection with the front metallization. Each field electrode is separated from the semiconductor substrate by a respective field dielectric extending through the body layer. Additional semiconductor device embodiments are described.

22 Claims, 9 Drawing Sheets

(51) Int. Cl.
  *H01L 29/06* (2006.01)
  *H01L 29/417* (2006.01)
  *H01L 29/66* (2006.01)
  *H01L 29/40* (2006.01)
  *H01L 29/423* (2006.01)
  *H01L 29/739* (2006.01)
  *H01L 29/861* (2006.01)
  *H01L 29/08* (2006.01)
  *H01L 27/07* (2006.01)

(52) U.S. Cl.
  CPC ...... *H01L 29/0696* (2013.01); *H01L 29/0834* (2013.01); *H01L 29/1095* (2013.01); *H01L 29/404* (2013.01); *H01L 29/407* (2013.01); *H01L 29/41708* (2013.01); *H01L 29/4236* (2013.01); *H01L 29/66136* (2013.01); *H01L 29/66348* (2013.01); *H01L 29/7397* (2013.01); *H01L 29/861* (2013.01); *H01L 29/8613* (2013.01)

(58) Field of Classification Search
  CPC ........... H01L 29/41708; H01L 29/0696; H01L 29/66136; H01L 29/407; H01L 29/404; H01L 29/4236; H01L 29/7397; H01L 29/66348; H01L 29/861; H01L 29/8613; H01L 27/0629; H01L 29/1025; H01L 29/42312; H01L 29/7398
  See application file for complete search history.

(56) References Cited

U.S. PATENT DOCUMENTS

| | | | |
|---|---|---|---|
| 2006/0118864 A1* | 6/2006 | Hirler | H01L 29/7811 257/335 |
| 2007/0040213 A1* | 2/2007 | Hotta | H01L 29/0696 257/330 |
| 2007/0155104 A1* | 7/2007 | Marchant | H01L 29/407 438/270 |
| 2008/0197406 A1* | 8/2008 | Parthasarathy | H01L 29/7813 257/329 |
| 2010/0200915 A1* | 8/2010 | Denison | H01L 29/42368 257/335 |
| 2012/0181575 A1 | 7/2012 | Pfirsch | |
| 2013/0020634 A1* | 1/2013 | Watanabe | H01L 29/0696 257/330 |
| 2013/0037853 A1* | 2/2013 | Onozawa | H01L 29/0839 257/139 |
| 2013/0043527 A1* | 2/2013 | Lui | H01L 23/647 257/330 |
| 2014/0048847 A1* | 2/2014 | Yamashita | H01L 29/36 257/140 |
| 2014/0175541 A1* | 6/2014 | Matri' | H01L 29/4238 257/334 |
| 2014/0217495 A1* | 8/2014 | Wutte | H01L 29/407 257/328 |
| 2015/0155277 A1 | 6/2015 | Ogura et al. | |
| 2015/0179636 A1 | 6/2015 | Pfirsch et al. | |
| 2015/0228723 A1* | 8/2015 | Werber | H01L 29/1095 257/140 |
| 2016/0111529 A1* | 4/2016 | Hirabayashi | H01L 29/0696 257/139 |
| 2016/0141400 A1* | 5/2016 | Takahashi | H01L 29/0834 257/140 |
| 2016/0141401 A1* | 5/2016 | Hirabayashi | H01L 29/407 257/139 |
| 2016/0247808 A1* | 8/2016 | Horiuchi | H01L 29/407 |
| 2016/0336435 A1 | 11/2016 | Naito | |
| 2016/0351668 A1 | 12/2016 | Schwetlick et al. | |
| 2017/0018548 A1* | 1/2017 | Laven | H01L 27/0727 |
| 2017/0025522 A1* | 1/2017 | Naito | H01L 29/407 |
| 2017/0257025 A1* | 9/2017 | Meiser | H01L 29/407 |
| 2017/0317175 A1* | 11/2017 | Naito | H01L 29/407 |
| 2017/0317207 A1* | 11/2017 | Hsieh | H01L 21/3086 |
| 2018/0005959 A1* | 1/2018 | Wang | H01L 29/1095 |
| 2018/0076193 A1* | 3/2018 | Shirakawa | H01L 27/0623 |
| 2018/0097094 A1* | 4/2018 | Naito | H01L 29/0696 |

* cited by examiner

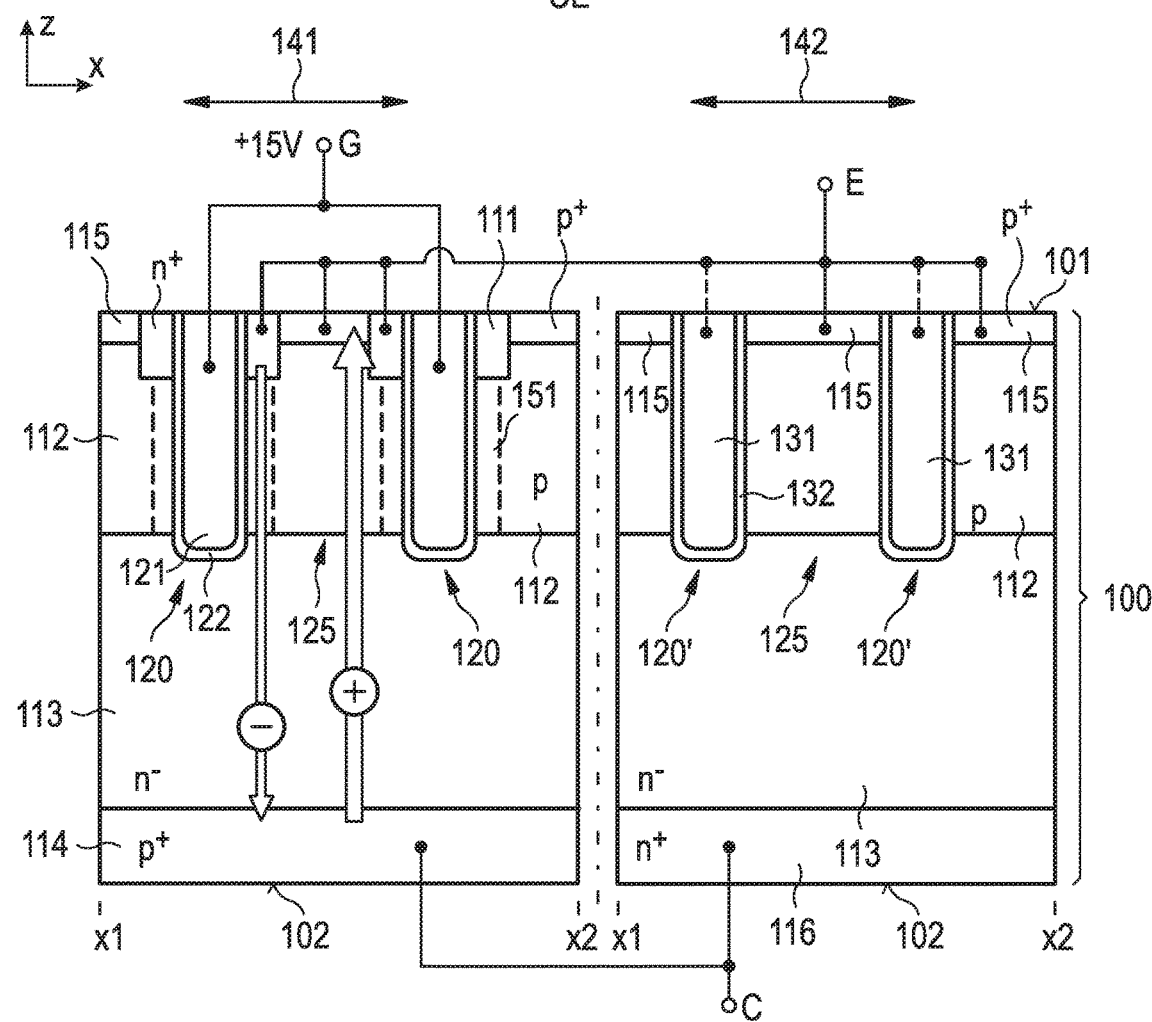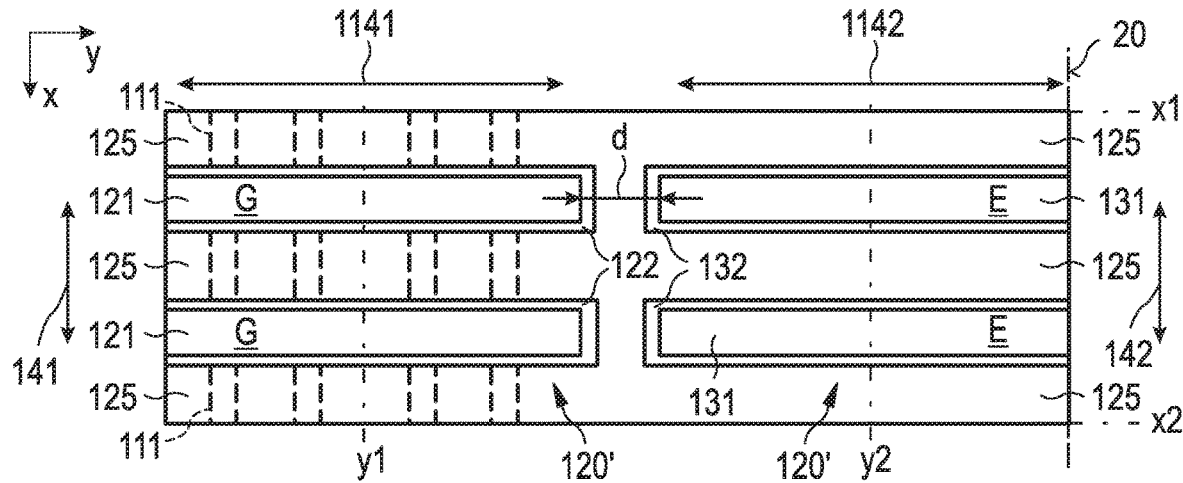

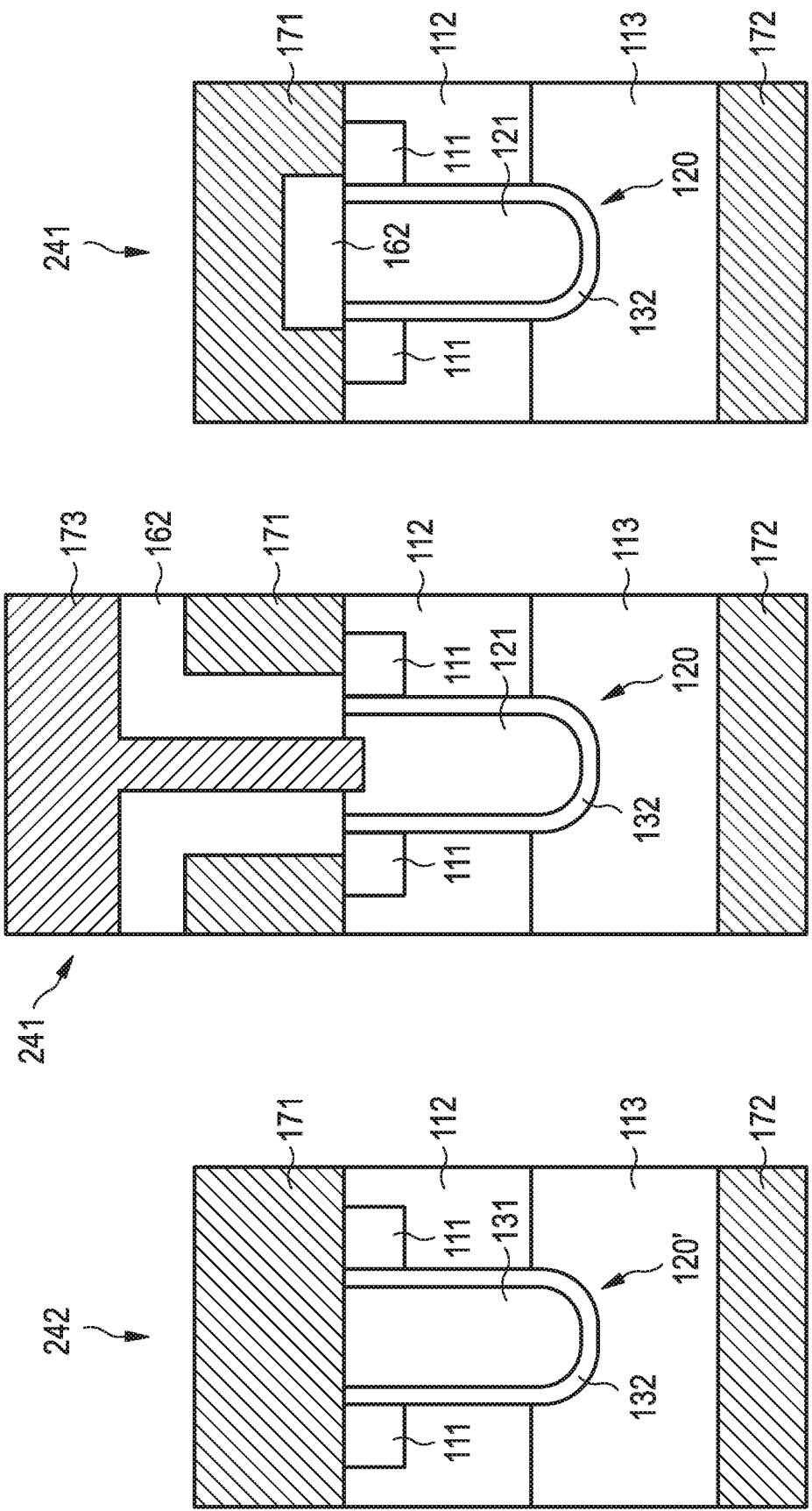

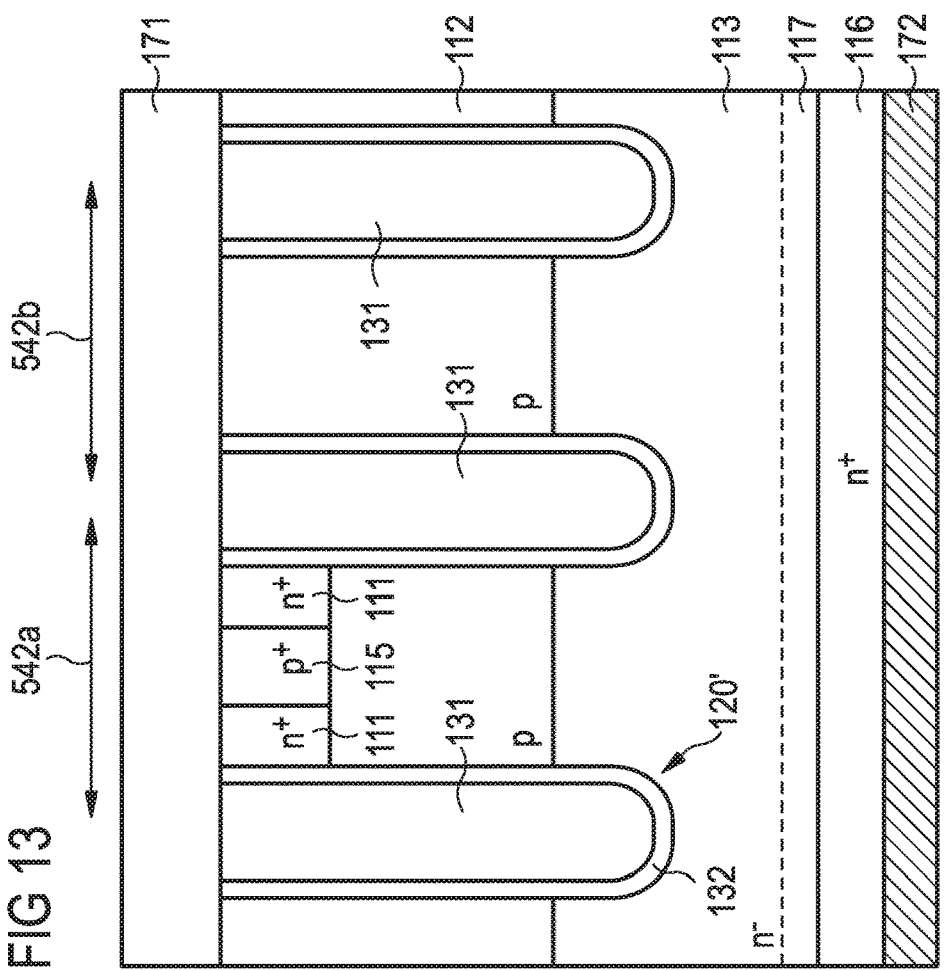
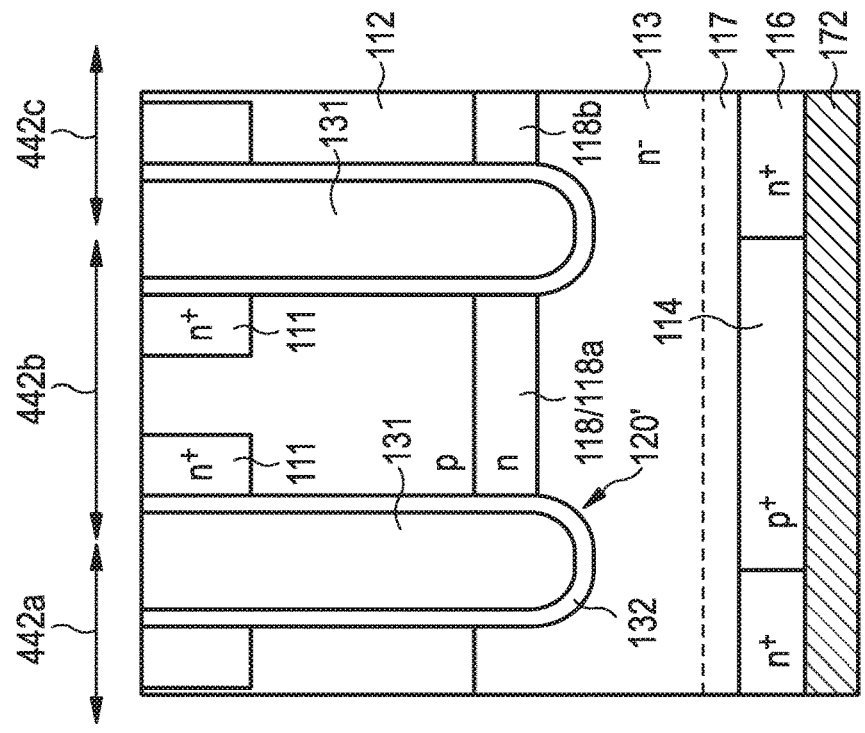

SEMICONDUCTOR DEVICE WITH AN IGBT REGION AND A NON-SWITCHABLE DIODE REGION

TECHNICAL FIELD

Embodiments described herein relate to semiconductor devices having an IGBT cell region and at least one free-wheeling diode region, in particular at least one non-switchable free-wheeling diode region.

BACKGROUND

IGBTs (Insulated Gate Bipolar Transistors) are very versatile power semiconductor devices since they have a very low saturation voltage $V_{CEsat}$ (at rated current) and on-state resistance, respectively. As IGBTs are widely used for controlling inductive loads, power modules which include IGBTs as active switches typically include so-called free-wheeling diodes which allow a current flow in reverse direction. The reverse current may be caused by the inductive load during switching.

An IGBT is a bipolar device. The low $V_{CEsat}$ is the result of a high charge carrier concentration, holes for n-channel IGBTs, which are emitted from the typically p-doped emitter into the drift region during forward conductive mode of the IGBT. The drift region is then flooded with excess charge carriers. When the IGBT is brought into the blocking mode, the excess charge carriers are to be removed from the drift region before the drift region is capable of blocking the required voltage.

Modern IGBTs may have integrated free-wheeling diodes so that no external free-wheeling diode is needed. IGBTs with integrated free-wheeling diodes are also referred to as RC-IGBTs (Reverse Current-Insulated Gate Bipolar Transistor) as the IGBT is adapted to carry also a reverse current.

It is often desired that the IGBT can also carry a reverse current when a gate voltage is applied to the gate electrodes of the IGBT cells. Activated IGBT cells, i.e. IGBT cells to which the gate voltage is applied, may however affect the bipolar operation in reverse current mode.

Further, a high robustness during commutating is often desired. In particular, igniting respective parasitic diode structures of RC-IGBTs arranged next to free-wheeling diode cells may significantly reduce the robustness during commutating. Igniting of the parasitic diode structures during commutating may be avoided by a large enough distance between an edge-termination structure and the free-wheeling diode cells. However, this increases chip area and thus costs. For example, the distance between the edge-termination structure and stripe shaped free-wheeling diode cells of 1200 V-RC-IGBTs having side by side arranged stripe shaped RC-IGBT-cells and free-wheeling diode cells should be at least about 300 µm.

There is therefore a desire to maintain or even improve device performance specifications for given chip size, while allowing robust reverse current characteristic.

SUMMARY

According to an embodiment, a semiconductor device includes a front side, a back side opposite the front side, a drift layer and a body layer arranged between the front side and the drift layer and forming a pn-junction with the drift layer. A front metallization is arranged on the front side and in Ohmic connection with the body layer. A back metallization is arranged on the back side and in Ohmic connection with the drift layer. The semiconductor device further includes at least one IGBT cell region and at least one free-wheeling diode region adjacent to the at least one IGBT cell region. The at least one IGBT cell region includes at least one gate electrode in Ohmic connection with a gate metallization of the semiconductor device, and electrically insulated from the semiconductor substrate. The at least one free-wheeling diode region includes at least one field electrode in Ohmic connection with the front metallization, and separated from the semiconductor substrate and the gate electrode. When seen in a first vertical cross-section perpendicular to the front side, the at least one gate electrode is arranged in a first trench extending through the body layer. When seen in a second vertical cross-section parallel to and spaced apart from the first vertical cross-section, the at least one field electrode is arranged in a second trench extending through the body layer. When seen in a normal projection onto a horizontal plane parallel to the front side, the at least one field electrode is substantially shaped as a second stripe, and the at least one gate electrode is substantially shaped as a first stripe arranged in a virtual extension of the second stripe.

According to an embodiment, a semiconductor device includes a gate metallization and a semiconductor substrate including a front side, a back side, a drift layer and a body layer arranged between the front side and the drift layer and forming a pn-junction with the drift layer. A front metallization is arranged on the front side and in Ohmic connection with the body layer. A back metallization is arranged opposite the front metallization and in Ohmic connection with the drift layer. The semiconductor device further includes at least one IGBT cell region and at least one free-wheeling diode region adjacent to the at least one IGBT cell region. The at least one IGBT cell region includes a plurality of gate electrodes in Ohmic connection with the gate metallization. The gate electrodes are electrically insulated from the semiconductor substrate by respective gate dielectrics extending through the body layer. The at least one free-wheeling diode region includes a plurality of field electrodes in Ohmic connection with the front metallization. The field electrodes are separated from the semiconductor substrate by respective field dielectrics extending through the body layer. When seen in a normal projection onto a horizontal plane parallel to the front side, the gate electrodes form a pattern of substantially parallel first stripes, and the field-electrodes form a pattern of substantially parallel second stripes. At least one of the second stripes runs towards one of the first stripes.

According to an embodiment, a semiconductor device includes a semiconductor substrate having a front side, a front metallization arranged on the front side, a back metallization opposite the front metallization, and a gate metallization. At least one IGBT cell region including a plurality of IGBT cells is integrated in the semiconductor substrate. Each IGBT cell includes a gate electrode arranged adjacent to and electrically insulated from the semiconductor substrate to define an operable switchable channel region for providing an Ohmic connection between the front metallization and a drift region of the semiconductor substrate. At least one free-wheeling diode region including a plurality of diode cells is integrated in the semiconductor substrate. Each of the diode cells includes a pn-junction arranged between the front metallization and the back metallization, and extending between two adjacent field-dielectrics of respective field electrode structures. Each of the field-electrode structures further includes a field-electrode which is not in Ohmic connection with the gate metallization and separated from the semiconductor substrate by the respective field-dielectric. When seen in a normal projection onto a horizontal plane parallel to the front side, the gate electrodes are substantially shaped as respective first stripes and the field-electrodes are substantially shaped as respective second stripes. At least one of the gate electrodes has an overlap with an adjacent one of the field-electrodes when seen in a normal projection onto a vertical plane perpendicular to a longitudinal axis of the adjacent one of the field-electrodes.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference signs designate corresponding parts. In the drawings:

FIG. 1A illustrates two cross-sectional views of a semiconductor device having an IGBT cell region and a non-switchable diode region, according to an embodiment described herein, in a forward operating mode;

FIG. 1B illustrates a plane view on the semiconductor device illustrated in FIG. 1A according to an embodiment described herein;

FIG. 10 illustrates a non-switchable diode according to an embodiment;

FIG. 11A illustrates an IGBT-cell according to an embodiment;

FIG. 11B illustrates an IGBT-cell according to an embodiment;

FIG. 12 illustrates a non-switchable diode cell according to an embodiment;

FIG. 13 illustrates a non-switchable diode cell according to an embodiment; and

DETAILED DESCRIPTION

Figure 1C:
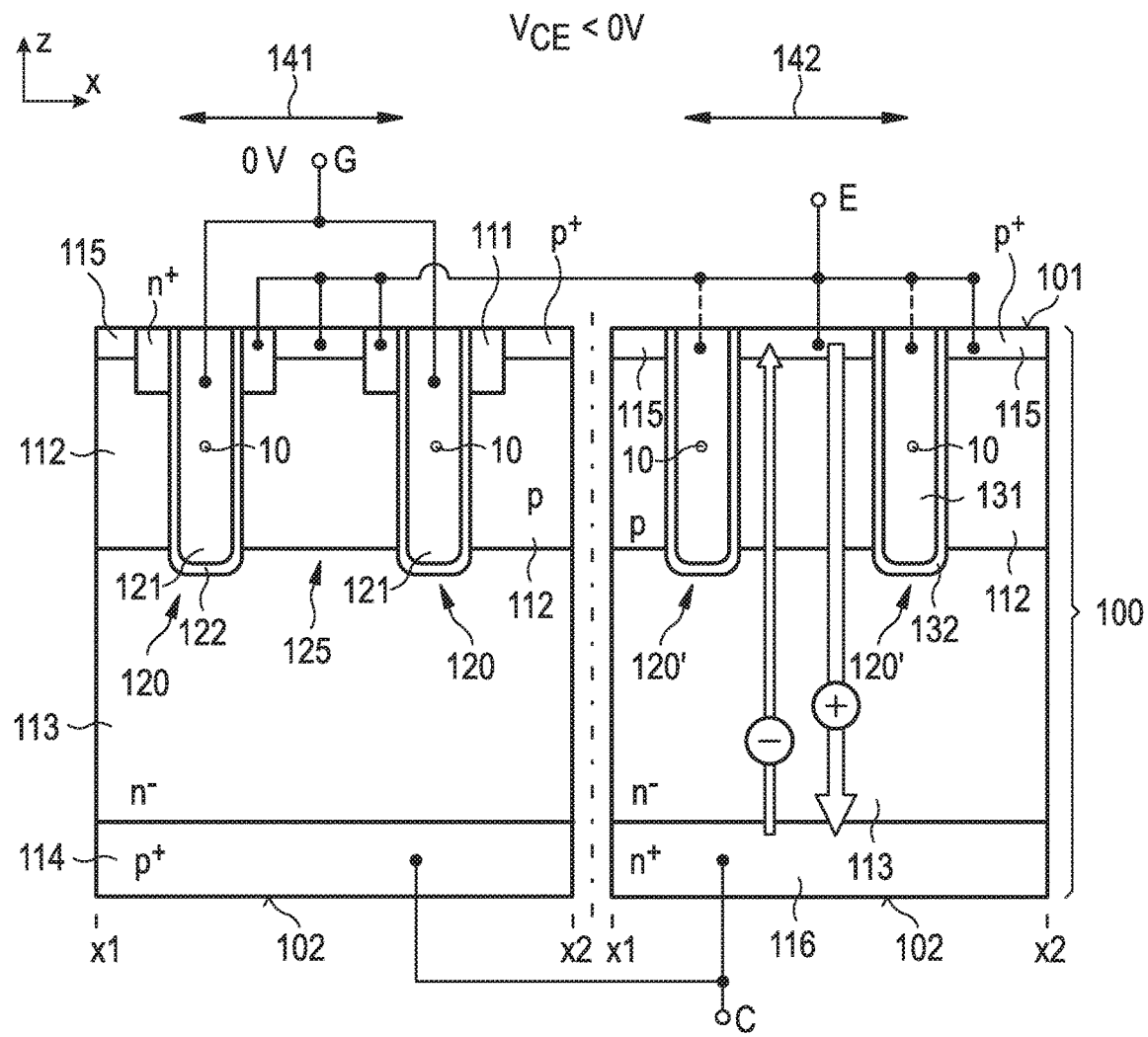
FIG. 1C illustrates the two cross-sectional views of the semiconductor device illustrated in FIG. 1A, according to an embodiment described herein, in a reverse conductive mode.

In the following detailed description, reference is made to the accompanying drawings, which form a part hereof, and in which are shown by way of illustration specific embodiments in which the invention may be practiced. In this regard, directional terminology, such as "top", "bottom", "front", "back", leading", "trailing", "lateral", "vertical" etc., is used with reference to the orientation of the figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

In this specification, a second side or surface of a semiconductor substrate is considered to be formed by the lower or back-side side or surface while a first side or surface is considered to be formed by the top or main side or surface of the semiconductor substrate. The terms "above" and "below" as used in this specification, likewise "top" and "bottom," therefore describe a relative location of a structural feature to another structural feature with consideration of this orientation. Furthermore, spatially relative terms such as "under", "below", "lower", "over", "upper" and the like, are used for ease of description to explain the positioning of one feature relative to a second feature. These terms are intended to encompass different orientations of the device in addition to different orientations than those depicted in the figures. Further, terms such as "first", "second", and the like, are also used to describe various features, regions, sections, etc. and are also not intended to be limiting. Like terms may refer to like features throughout the description.

Herein, particularly when referring to the trench, gate electrode, and/or conductor, for example, the "length," "extension," and "extent" can be used interchangeably, and can refer to a long axis of the feature. "Width" can refer to the direction of the structure which is perpendicular to the extension. "Width" and "length" can also refer to dimensions in the width and length directions, respectively.

The terms "electrical connection" and "electrically connected" describe an Ohmic connection between two features.

The terms "channel region" and "switchable channel region" describe a portion of the body region adjacent to and along the gate dielectric where the so-called inversion channel may be formed under the influence of the field effect. The channel region (switchable channel region) is an unipolar channel region.

Herein, a "normal projection" onto a plane or surface means a perpendicular projection onto the plane or surface. In other words, the view direction is perpendicular to the surface or plane.

The semiconductor substrate can be made of any semiconductor material suitable for manufacturing semiconductor components. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used.

N-doped regions are referred to as of first conductivity type while p-doped regions are referred to as of second conductivity type. It is, however, possible to exchange the first and second conductivity type so that the first conductivity type is p-doped and the second conductivity type is n-doped.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. With the above range of variations and applications in mind, it should be understood that the present invention is not limited by the foregoing description, nor is it limited by the accompanying drawings. Instead, the present invention is limited only by the following claims and their legal equivalents.

FIG. 1A illustrates a semiconductor device according to an embodiment in a forward mode—or a forward conductive mode—with a positive gate voltage of, for example, +15 V, applied to the gate electrodes 121 of the semiconductor device. The collector-emitter voltage $V_{CE}$ is positive, i.e. the technical current flow is from collector terminal C to the emitter terminal E. The physical current flow of the electrons is from the emitter terminal E to the collector terminal C. A forward conductive mode generally means that, in case of n-channel devices as illustrated in FIG. 1 and the embodiments below, a positive gate voltage (gate terminal G is positive relative to emitter terminal E) above a gate threshold voltage $V_{th}$ is applied to the gate electrodes to form respective inversion channels in switchable channel regions between the drift region and the emitter region, often also referred to as source region, and that the collector-emitter voltage WE is positive (collector terminal C is positive relative to emitter terminal E). A forward blocking mode generally means that, in case of n-channel devices, a gate voltage below the gate threshold voltage $V_{th}$ is applied so that no inversion channels between the source and the drift regions are formed, and that the collector-emitter voltage $V_{CE}$ is positive.

The semiconductor device can be a power RC-IGBT and includes a semiconductor substrate 100, a front metallization 171 on a first or front surface or side 101 of the semiconductor substrate 100, and a back metallization 172 on a second or bottom surface or side 102 of the semiconductor substrate 100. The front and back metallizations 171 and 172 are for example illustrated in FIGS. 10 to 14.

The semiconductor device includes a plurality of doping regions. A drift layer or region 113 of the semiconductor substrate 100 is typically weakly n-doped. Highly n-doped emitter or source regions 111 can be integrated in the semiconductor substrate 100 at the first surface, front side or first side 101. The source regions 111 form respective pn-junctions with p-doped body regions 112 formed by portions of a body layer 112 of the semiconductor substrate 100. The body regions 112 also form respective pn-junctions with the n-doped drift region 113, which pn-junctions are different to, and spaced apart from, the pn-junctions formed between the body regions 112 and the emitter regions (source regions) 111. The drift region or layer 113 may be formed by a portion of a weakly n-doped substrate 100 into which the other doping regions are integrated by implantation or other suitable processes.

The field electrodes 131 are typically electrically connected with the emitter terminal E and therefore on the same electrical potential as the source regions 111. Accordingly, any influence of the gate electrodes 121 on the operation of the free-wheeling diode region 1142 is further reduced. However, at least some of the field electrodes 131, for example every second or third field electrode 131, may also be floating.

At a side toward the second surface, second side or back side 102, the drift region 113 forms pn-junctions with p-doped emitter regions 114, which form emitter regions of the second conductivity type. In addition to that, n-doped emitter regions 116, which form emitter regions of the first conductivity type, are also integrated in the semiconductor substrate 100 at the second surface 102. The n-doped emitter regions 116 and the p-doped emitter regions 114 are electrically in contact (Ohmic connection) with the back metallization 172 that is connected to the collector terminal C. Further, respective pn-junctions may be formed between adjacent n-doped emitter regions 116 and p-doped emitter regions 114. Typically, the back metallization 172 is in direct contact with the n-doped emitter regions 116 and the p-doped emitter regions 114.

An optional n-doped buffer or field stop layer can be integrated into the semiconductor substrate 100 between the drift region 113 and the respective emitter regions 114 and 116, or only between the drift region 113 and the p-doped emitter regions 114. The buffer or field stop layer has a higher doping concentration than the drift region 113 but typically a lower doping concentration than the n-doped emitter regions 116. The emitter regions 114, 116 are both highly doped. A buffer or field stop layer 117 is, for example, illustrated in FIGS. 12 and 13, and can be integrated in all of the embodiments illustrated herein. Typically, many modern devices include a buffer or field stop layer 117. Devices which include such a buffer or field stop layer are also referred to as punch-through devices.

The body regions 112 are in electrical connections with the front metallization 171 which is in electrical connection with the emitter terminal E. To improve the Ohmic connection between the body regions 112 and the front metallization 171, highly p-doped body contact regions 115 can be provided at the first surface 101. The source regions 111 are also in direct electrical connection with the front metallization 171. Typically, the front metallization 171 is in direct contact or connection with the body regions 112, or the body contact regions 115, and the source regions 111.

The semiconductor device further includes a plurality of trenches 120, 120' integrated into the semiconductor substrate 100. The trenches 120, 120' extend vertically from the first surface 101 into the semiconductor substrate 100. The trenches 120 can include respective gate electrodes 121 which are electrically insulated from the surrounding semiconductor substrate 100 by a gate dielectric 122. Likewise, the trenches 120' can include respective field electrodes 131 which are electrically insulated from the surrounding semiconductor substrate 100 by a field dielectric 132. In the following, the trenches 120, 120' are also referred to as first or gate trenches 120 and second or field trenches 120', respectively.

Both the gate trenches 120 and the field trenches 120' can extend longitudinally in rows. The longitudinal extension runs here perpendicular to the plane of the FIG. 1A (y-direction of the exemplary Cartesian co-ordinate system (x,y, z) additionally shown in the figures). Mesa regions 125 are formed by the semiconductor substrate 100 between adjacent trenches 120 and 120', respectively, as shown in the two the vertical cross-sections of FIG. 1A.

Both the gate trenches 120 and the field trenches 120' can extend in vertical direction z through the body layer 112, typically from the first surface 101 partly into the drift region 113, more typically to substantially the same depth. Accordingly, manufacturing may be facilitated.

Typically, a plurality of IGBT cells 141 are integrated in the semiconductor substrate 100 and form at least one IGBT cell region 1414. Each of the IGBT cells 141 includes at least one, for example two operable switchable channel regions 151 for providing an Ohmic connection, i.e., a controllable Ohmic connection, between the front metallization 171 and the drift region 113 of the semiconductor substrate 100. The switchable channel regions 151 are formed in the body regions 112 adjacent to the trenches 120 along the extension of the gate electrodes 121. When a positive voltage difference $V_{ge}=V_G-V_E$ above a given gate threshold voltage $V_{th}$, which is for Si typically in a range between about 4 V and about 9 V, is applied between the gate electrodes 121 and the front metallization 171, electrons are accumulated in the switchable channel regions 151 to form an unipolar conductive path (for electrons only for the illustrated n-channel IGBT cells), i.e., the so-called inversion channel, between the source regions 111 and the drift regions 113. Hence, the Ohmic connection provided by the switchable channel regions 151 is controllable through the voltage applied to the gate electrodes 121.

Typically, a plurality of non-switchable diode cells 142 are also integrated in the semiconductor substrate 100 and form at least one non-switchable free-wheeling diode region 1142. Each of the non-switchable diode cells 142 includes a pn-junction between the respective body region 112 and the drift region 113. This means that no Ohmic connection, in particular no Ohmic connection for electrons for the illustrated n-channel device, may be formed between the front metallization 171 and the drift regions 113 during normal device operation.

According to an embodiment, no inversion channels are formed through the body regions of the non-switchable diode cells 142 and the non-switchable free-wheeling diode region 1142, respectively, during normal operation, at least for typical differences $V_{ge}$ in a range from about −15 V to about +15 V or even in a range from about −20 V to about +20 V.

Alternatively or in addition, no source regions may be formed in the non-switchable diode cells 142.

The lateral geometric extension of a cells (in x-direction) as shown here corresponds to the pitch (length of the arrows 141, 142) at which the gate trenches 120 and the field trenches 120', respectively, are laterally spaced. Typically, the pitch of the cells 141, 142 is substantially equal, e.g. equal except for manufacturing tolerances. However, the ratio between the pitch of the cells 141 and the pitch of the cells 142 may also be in a range from about 0.5 to about 2.

According to embodiments, one or more of the cells 141 and/or one or more of the cells 142 may be left out in an otherwise respective regular pattern.

The definition of the cells 141, 142 is somewhat arbitrary. In FIG. 1A, each cell 141, 142 extends in x-direction between vertical symmetry lines of adjacent (typically mirror-symmetrical) trenches 120 and between vertical symmetry lines of adjacent (typically mirror-symmetrical) trenches 120', respectively. In an alternative definition, cells (of substantially the same pitch) extend in x-direction between vertical symmetry lines of adjacent mesas (mesa regions) 125.

As illustrated in FIG. 1A, the structure of the mesa region 125 between two adjacent trenches 120 may be mirror-symmetrical, i.e., the mesa region 125 forms with the first of the two adjacent trenches 120 the same type of half-cell as with the second of the two adjacent trenches 120. It is, however, also possible that different types of cells are integrated in the same mesa region 125. For example, different types of cells can be formed at different locations in the longitudinal extension of the mesa regions 125, or at opposite sides of adjacent trenches 120. The type of cell can thus vary in the longitudinal extension (direction) of the trenches 120 and mesa regions 125, or laterally, i.e. along a direction perpendicular to the longitudinal extension.

According to an embodiment, each of the IGBT cells 141 has a source region 111 of a first conductivity type in Ohmic connection with the front metallization 171, a drift region 113 of the first conductivity type, a body region 112 of a second conductivity type in Ohmic connection with the front metallization 171, arranged between the source region 111 and the drift region 113 and forming respective pn-junctions with the source region 111 and the drift region 113.

Furthermore, each of the IGBT cells 141 can include a gate electrode 121 arranged adjacent to and electrically insulated from the body region 112 by a respective gate dielectric 122 to define the respective switchable channel region 151 of each of the IGBT cells 141.

As illustrated in FIG. 1B by the dashed rectangles, several source regions 111 may extend between the gate dielectrics 122 of adjacent gate electrodes 121.

The pitch of the source regions 111 may be equal or in the range of the distance d between the gate electrodes 121 and the field electrodes 131.

The distance between adjacent source regions 111 may be in a range from about 0.5 µm to about 20 µm, more particular in a range from about 1 µm to about 10 µm, for example about 2 µm, 4 µm or 10 µm.

Alternatively, the source regions 111 may extend (in y-direction) substantially along an adjoining one of the gate dielectrics 122.

According to embodiments, several spaced apart source regions extend (in y-direction) along an adjoining one of the gate dielectrics and typically form a regular pattern, wherein a ratio between a length of the source regions and a spacing between adjacent source regions (in y-direction), is typically in a range from about 0.1 µm to about 10 µm, more typically in a range from about 0.3 µm to about 2 µm, and even more typically in a range from about 0.5 µm to about 1 µm.

In view of the above, according to an embodiment, each of the non-switchable diode cells 142 can have a drift region 113 of the first conductivity type and a body region 112 of the second conductivity type which forms with the drift region 113 a pn-junction extending between adjacent field dielectrics 132, wherein the body region 112 is in Ohmic connection with the front metallization 171.

According to an embodiment, at least some of the non-switchable diode cells 142 include a body contact region 115 of the second conductivity embedded in the body region 112 and having a higher doping level than the body region 112, wherein the body contact region 115 forms an Ohmic connection, typically an Ohmic contact with the front metallization 171.

Each of the respective regions, i.e., the IGBT cell region 1141 and the non-switchable free-wheeling diode region 1142, typically includes a plurality of respective identical cells. Clustered cells of the same cell type may form the respective region.

The non-switchable diode cells 142 are therefore "clustered" to form larger cell regions, i.e., one or more non-switchable free-wheeling diode region 1142. These cell regions can also be described as "meta cells" as each of the "meta cells" functions as a large diode for carrying a reverse current.

The clustering of the non-switchable cells 142 ensures that the reverse current is predominantly carried by a bipolar current and that the n-doped emitter region(s) 116 which are arranged opposite the non-switchable cells 142 can efficiently inject electrons into the drift region 113 during the reverse mode of the semiconductor device. Additionally, the latch-up risk can be reduced which further contributes to the robustness of the semiconductor device.

According to an embodiment, each of the IGBT cells 141 or the IGBT cell region or IGBT cell regions is formed above the emitter region 114 of the second conductivity type.

According to an embodiment, the non-switchable diode cells 142 or switchable free-wheeling diode regions are formed above a bimodal region formed by a plurality of emitter region 116 of the first conductivity type and a plurality of emitter region 114 of the second conductivity type.

According to an embodiment, in a normal projection onto the back side 102 of the semiconductor substrate 100, at least 50%, typically at least 75%, more typically at least 90% of the area covered by the non-switchable free-wheeling diode region 1142 is above emitter region(s) 116 of the first conductivity type (for example n-doped) formed at the back side 102 of the semiconductor substrate 100. The remaining area covered by the non-switchable free-wheeling diode region 1142 is then above an emitterregion(s) 116 of the second conductivity type.

The non-switchable free-wheeling diode region or regions typically does not comprise any operable switchable channel region, i.e., neither a switchable diode cell nor an IGBT cell 141 is integrated within the area assumed by the non-switchable free-wheeling diode region. A non-switchable free-wheeling diode region can thus also be defined to be a region where no (in particular no cell with an) operable switchable channel region 151 is formed. An operable switchable channel region 151 is a region where an inversion channel can be formed when applying a positive voltage (or a negative voltage if the doping relations are reversed) to an adjacent gate electrode 121.

When no operable switchable channel region 151 is formed within the non-switchable free-wheeling diode region, the functional operation of the non-switchable free-wheeling diode region is not affected by the action of the operable switchable channel region 151, 153, i.e. whether a gate voltage is applied or not. This is beneficial for specific operational modes of the semiconductor device.

To avoid formation of the operable switchable channel region 151 within the non-switchable free-wheeling diode region, the gate electrodes in the trenches 120', which are formed in the non-switchable free-wheeling diode region, can be electrically insulated from the gate terminal so that no gate voltage is applied. Alternatively, no electrodes may be formed in the field trenches 120' and/or no source regions 111 are formed and/or the source regions 111 are not electrically connected to the emitter terminal E.

When a positive voltage such as +15 V is applied to the gate electrodes of the IGBT cells 141, a conductive path is formed in the respective switchable channel region 151, 153 which short-circuits the pn-junctions between the body region 112 and the drift region 113, and between the source region 111 and the body region 112, respectively. An electron current can thus flow from the source regions 111 to the drift region 113 and finally to the p-doped emitter regions 114 and the n-doped emitter regions 116 when a positive collector-emitter voltage $V_{CE}$ is applied between the collector terminal C and the emitter terminal E. The flow of the electrons is indicated by the downward pointing arrow while the flow of the positive holes is indicated by the upward pointing arrow. The holes do not flow through the switchable channel region 151 as they can easily pass the pn-junction between the body region 112 and the drift region 113. The holes are injected from the p-doped emitter regions 114. The IGBT cells 141 thus carry a bipolar current. The dashed rectangles in FIG. 1A roughly illustrate the region in the body region 112 where the respective switchable channel regions 151 are formed.

In the forward conductive mode as illustrated in FIG. 1A, the non-switchable diode cells 142 are "inactive" as the pn-junction between the body region 112 and the drift region 113 blocks any electron flow through the non-switchable diode cells 142.

A reverse conductive mode of operation is illustrated in FIG. 1C with a negative collector-emitter voltage ($V_{CE}$>0) applied between the collector terminal C and the emitter terminal E. In this case, a reverse current flows, which may be driven by an unillustrated inductive load connected to the collector terminal C and the emitter terminal E. Independent of the gate voltage. A current through the IGBT cells 141 is prevented due to the reversely biased pn-junction between the drift region 113 and the p-doped emitter region 114 which is arranged at the second surface 102. On the other hand, a bipolar current flows through the non-switchable diode cells 142. Such a bipolar current is enabled when the voltage difference over the pn-junction between the body region 112 and the drift region 113 is equal to or larger than the required forward voltage drop of this pn-junction.

Reverse current means that a current flow (direction of the technical current flow) is reverse with respect to the current flow (direction of the technical current flow) of the forward conductive mode. The technical current flow is defined to be the direction in which positive charge carriers flow.

It should be noted that the n-channel semiconductor device as illustrated in FIGS. 1A to 1D is capable of blocking a positive $V_{CE}$ but substantially not a negative $V_{CE}$ due to the integrated free-wheeling diode region(s) 1142.

As illustrated in FIG. 1A and FIG. 1B, each of the gate trenches 120 may be arranged in virtual extension of one of the field trenches 120, when seen in a normal projection onto a horizontal plane (xy-plane) parallel to the front side 101 and in a horizontal cross-section, respectively. Likewise, each of the gate electrodes 121 may be arranged in virtual extension of one of the field electrodes 131, when seen in a normal projection onto horizontal planes (xy-plane) parallel to the front side 101 and in horizontal cross-sections through the electrodes 121 and 131, respectively.

As indicated by the dashed dotted vertical lines and the horizontal positions x1, x2 in FIG. 1A and FIG. 1B, FIG. 1A shows two vertical cross-sections through the semiconductor substrate 100 at different horizontal positions y1, y2 with respect to the elongation direction y of the electrodes 121, 131 and the wiring concept.

As illustrated in FIG. 1B, the gate electrodes 121 and the field electrodes 131 are typically at least substantially shaped as first and second stripes, respectively, e.g, as respective (in y-direction) elongated rectangles that may have rounded edges, and the first stripes 121 are arranged in virtual extension of a corresponding adjacent second stripe 131 when seen in the normal projections and horizontal cross-sections, respectively.

Figure 1D:
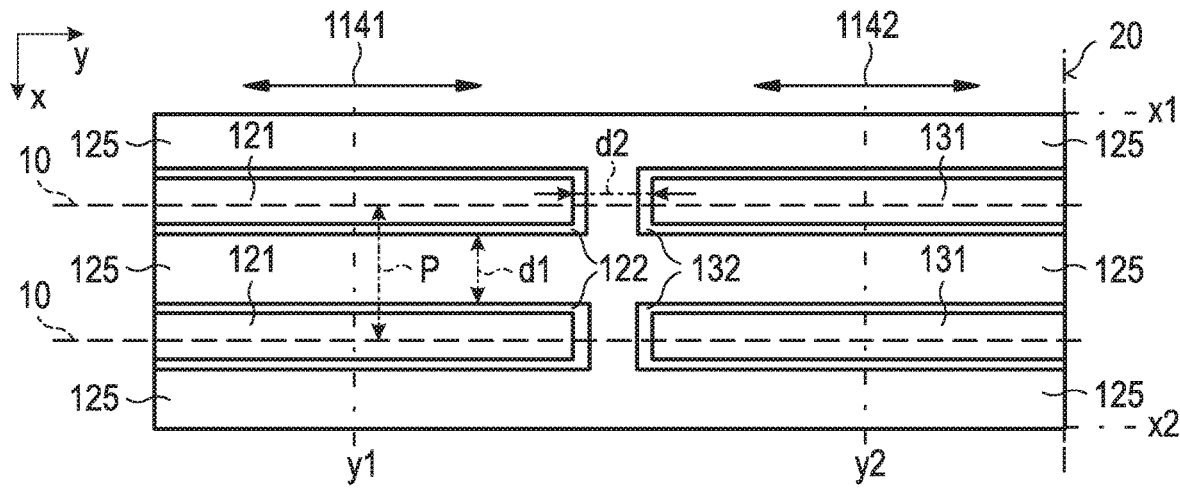
FIG. 1D illustrates a plane view on the semiconductor device illustrated in FIG. 1A according to an embodiment described herein.

As illustrated in FIG. 1D showing a less detailed view than FIG. 1B, pairs of adjacent first and second stripes (electrodes) 121, 131 are typically at least substantially centered with respect to each other and a common symmetry or elongation axis 10 of the respective electrode pair.

It is, however, also possible that the first and second stripes (electrodes) 121, 131 are slightly off-set. For example, the first stripes 121 may be shifted with respect to the second stripes 131 in x-direction (i.e. a horizontal direction perpendicular to the elongation direction y) by at most 50%, more typically by at most 10% and even more typically by at most 5% of a common or average pitch P of the cells 141, 142.

In other words, one or more, typically all of the gate electrodes 121 may have, when seen in a normal projection onto a vertical plane 20 which perpendicular to the longitudinal axis 10 of an adjacent one of the field-electrodes 131, an overlap with an adjacent one (closest one) of the field-electrodes 131 which is at least about 80%, particularly at least about 90% or even 95%.

Further, it is also possible that the first and second stripes (electrodes) 121, 131 are slightly angled with respect to each other. For example, the first stripes 121 may have elongation axes 10 which form with elongation axes 10 of the second stripes 131 respective angles of typically at most 25°, more typically at most 10° and even more typically at most 5%, but typically in such a way that the second stripes run towards a respective one (closest one) of the first stripes.

Aranging the gate electrodes 121 of the IGBT cell region substantially in virtual extension of the field-electrodes 131 of the adjacent free-wheeling diode region (typically pair-wise in a row) allows for a given commutation robustness a significantly reduced chip area compared to previously used stripe designs in which the elongated gate electrodes and the elongated field electrodes are arranged side by side. In the previously used stripe designs, the diode regions of the component should have a distance from an outer edge-termination region which is of the order and larger than (and thus increases with the voltage class) the thickness of the semiconductor substrate to avoid igniting a parasitic diode structure in the edge-termination region. Note that igniting parasitic diode structures would undermine the desired commutation robustness.

Typically, the outer edge-termination region includes at least one edge-termination structure such as a floating field plate, a field plate in Ohmic connection with the back metallization, a guard ring, or a VLD-structure (variable lateral doping concentration) surrounding the IGBT cell region 1141 when seen from above. In the following, the outer edge-termination region is also referred to as peripheral area.

The term "edge-termination structure" as used in this specification intends to describe a structure that is configured to provide in a blocking mode a transition region in which the high electric fields around an active area (e.g. with IGBT cells and diode cells) of the semiconductor device change gradually to the potential at or close to the edge of the device and/or between a reference potential such as ground and a high voltage e. g. at the edge and/or backside of the semiconductor device. The edge-termination structure may, for example, lower the field intensity around a termination region of a rectifying junction by spreading the electric field lines across the edge termination region.

For example, 1200 V—class RC-IGBTs of the previously used stripe designs typically have a substrate thickness of 100-120 µm and a desired minimum distance between the diode region and the edge-termination region of about 300 µm.

Different thereto, the desired distance between the free-wheeling diode (cell) region and the IGBT cell region (for safely avoiding igniting parasitic diode structures) is of the order of the pitch of the gate electrodes 121 and the field electrodes 131, respectively.

More particular, a ratio d2/d1 between a distance d2 from one or more of the gate electrodes 121 to a respective adjacent field electrode 131 and a distance d1 between adjacent field electrodes 131 is typically in a range between about 0.25 to about 5, preferably in a range between about 0.5 to about 2, even if the semiconductor device is implemented as a power semiconductor device, for example a semiconductor device with a rated breakdown voltage of at least 600 V or even at least 1000 V.

Further, as gate electrodes may not be present in the diode cell region(s), the controllability of the component by the gate potential in the free-wheeling mode is reduced. The desire for a low or minimum controllability RC-IGBTs is based on the fact that the additional effort for a control is often desired to be low. In order to make the region between the IGBT-cell region and the free-wheeling diode cell region usable for the IGBT operation, it is also often desired that the gate electrodes are close to (but spaced apart from) the free-wheeling diode cell region. Both requirements are met by the new stripe design described herein.

A non-switchable freewheeling (cell) region 1142 may be defined by a plurality of non-switchable diode cells.

The non-switchable free-wheeling diode region 1142 ensures that the semiconductor device is quickly rendered conductive when the load current, i.e. $I_{CE}$, transits from the forward current to the reverse current independently whether any of the switchable channel regions 151 is conductive or not. The snapping-back behavior is suppressed and the semiconductor device is already reversely conductive at low reverse currents.

The IGBT cell region 1141 provides the actual IGBT function for switching a load current.

Each of the above types of regions 1141, 1142 can be optimized for their respective function without (significantly) influencing the other type of region. For example, the anode efficiency, i.e., the efficiency of the respective body regions 112 to inject charge carriers into the drift region 113, may differ between the regions 1141, 1142.

Figure 2:
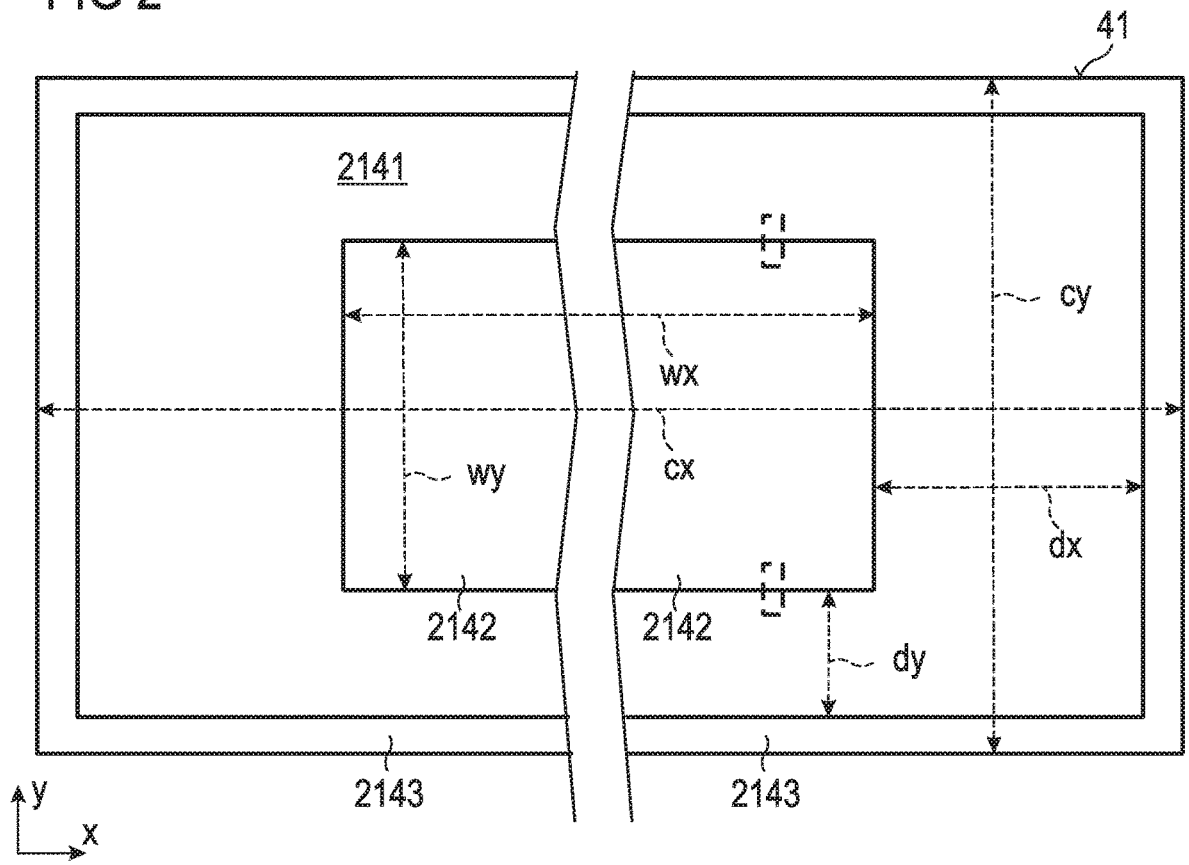
FIG. 2 illustrates a plane view on a semiconductor device having an IGBT cell region and a non-switchable diode region according to an embodiment described herein.

As illustrated in FIG. 2, the semiconductor device may have one single large IGBT cell region 2141 (which may form a simply connected area) which includes all IGBT cells 141.

In the exemplary embodiment, the (in plan view and when seen in plane projection onto the front side, respectively) substantially ring-shaped IGBT cell region 2141 surrounds one large non-switchable free-wheeling diode region 2142 (which may also form a simply connected area). It is, however, also possible that a substantially ring-shaped free-wheeling diode region surrounds an IGBT cell region.

Further, the IGBT cell region 2141 is surrounded by a peripheral area 2143 arranged between the IGBT cell region 2141 and an edge 41 of the semiconductor substrate when seen from above. The peripheral area 2143 may include one or more edge-termination structures surrounding the IGBT cell region 2141 when seen from above and arranged next to the front side and a pn-junction formed between the body region 112 and the drift region 113 that may at least come close to the front side in the peripheral area. Thus, the peripheral area 2143 may function as edge-termination region of the semiconductor device. The width of the peripheral area 2143 may, depending on voltage class, be in a range from about 100 μm to 2 mm, more particular from about 250 μm to about 1 mm.

According to an embodiment, a p-doped region having a lower doping concentration than the emitter regions 114 is formed in the peripheral area 2143 and between the drift region 113 and the back metallization. The p-doped region may extend to the edge and is typically substantially ring-shaped when seen from above and in a normal projection onto the front side, respectively.

The IGBT cell region 2141 may include a 1-dimensional pattern of parallel trench gate electrodes which are shaped as stripes when seen from above. The trench gate electrodes may, depending on the horizontal location, substantially extend in y-direction between the free-wheeling diode region 2142 and the peripheral area 2143 or between two portions of the peripheral area 2143.

Likewise, the free-wheeling diode region 2142 may include a plurality of trench field electrodes typically having the same pitch than the trench gate electrodes. Further, the trench field electrodes may substantially extend in y-direction through the free-wheeling diode region 2142. However, as explained above, the trench field electrodes and the trench gate electrodes are spaced apart from each other.

In a portion which is central with respect to the x-direction, a regular arrangement of substantially parallel rows of two gate electrodes and an intermediate field electrode which are elongated in y-direction is typically formed.

Typically, the free-wheeling diode region 2142 is substantially centered with respect to the IGBT cell region 2141. Accordingly, a more symmetric current distribution and thus a better thermal load may be achieved during device operation.

In the exemplary embodiment, the semiconductor substrate and the free-wheeling diode region 2142 are substantially rectangular when seen from above.

Each of the small dashed rectangles in FIG. 2 (to FIG. 5) may correspond to a transition area as shown in FIG. 1A and FIG. 1D.

The horizontal dimension cx, cy of the semiconductor substrate or the IGBT cell region 2141 may be in arrange from about 1 to 25 mm, more particular from about 2 to 10 mm.

The horizontal dimension wx, wy of the free-wheeling diode region 2142 may be in arrange from about 1 to 10 mm, more particular from about 200 μm to 2 mm.

The widths dx, dy of the IGBT cell region 2141 may be in arrange from about 200 μm to 10 mm, more particular from about 500 μm to 5 mm.

Typically, the area of the free-wheeling diode region 2142 is in a range from about 10% to about 60%, more particular from about 30% to about 50% of the area of the free-wheeling diode region 2142.

Figure 3:
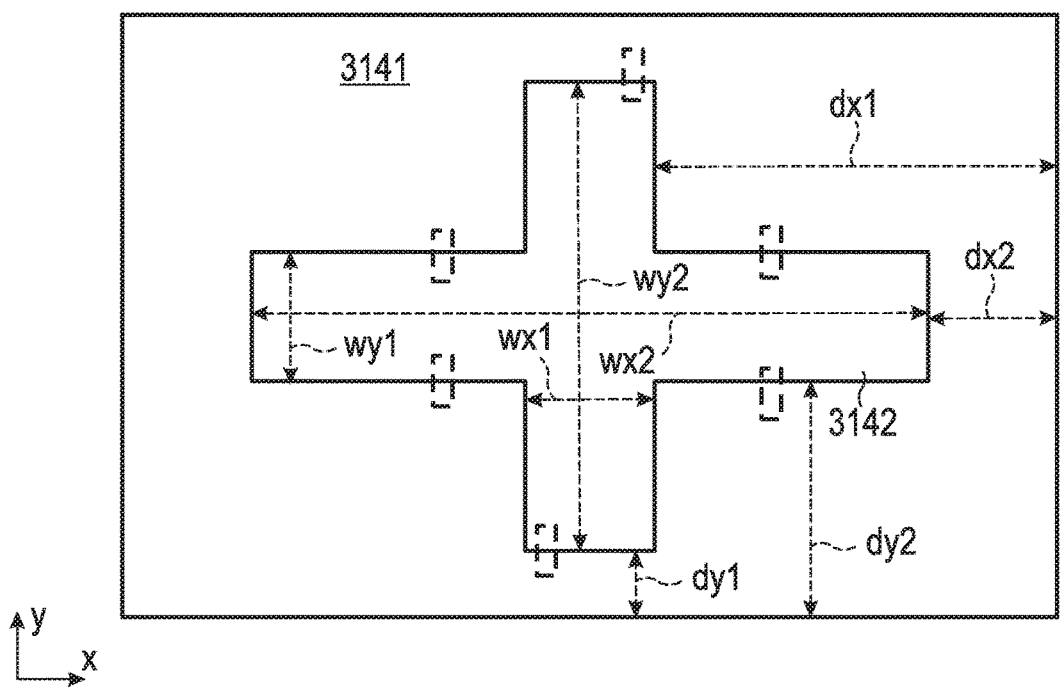
FIG. 3 illustrates a plane view on a semiconductor device having an IGBT cell region and a non-switchable diode region according to an embodiment described herein.

As illustrated in FIG. 3, the free-wheeling diode region 3142 may also be substantially cross-shaped when seen from above.

The area percentages of the free-wheeling diode region 3142 and the IGBT cell region 3141 may be as explained above for the free-wheeling diode region 2142 and the IGBT cell region 2141.

Typical dimensions of the free-wheeling diode region 3142 and the IGBT cell region 3141 are given in the following.

A first horizontal maximum thickness dx1 of the IGBT cell region 3141 between the free-wheeling diode region 3142 and an outer edge of the IGBT cell region 3141 is typically in a range from about 500 μm to about 10 mm, more typically in a range from about 750 μm to about 2 mm.

A first horizontal minimum thickness dx2 of the IGBT cell region 3141 between the free-wheeling diode region 3142 and an outer edge of the IGBT cell region 3141 is typically in a range from about 100 μm to about 5 mm, more typically in a range from about 200 μm to about 1 mm.

A second horizontal maximum thickness dy1 of the IGBT cell region 3141 between the free-wheeling diode region 3142 and an outer edge of the IGBT cell region 3141 is typically in a range from about 500 μm to about 10 mm, more typically in a range from about 750 μm to about 2 mm.

A second horizontal minimum thickness dy2 of the IGBT cell region 3141 between the free-wheeling diode region 3142 and an outer edge of the IGBT cell region 3141 is typically in a range from about 100 μm to about 5 mm, more typically in a range from about 200 μm to about 1 mm.

A first maximum horizontal extension wx2 of the free-wheeling diode region 3142 is typically in a range from about 100 μm to about 20 mm, more typically in a range from about 500 μm to about 2 mm.

A first minimum horizontal extension wx1 of the free-wheeling diode region 3142 is typically in a range from about 50 μm to about 5 mm, more typically in a range from about 200 μm to about 1 mm.

A second maximum horizontal extension wy2 of the free-wheeling diode region 3142 is typically in a range from about 100 μm to about 20 mm, more typically in a range from about 500 μm to about 2 mm.

A second minimum horizontal extension wy1 of the free-wheeling diode region 3142 is typically in a range from about 50 μm to about 5 mm, more typically in a range from about 200 μm to about 1 mm.

Figure 4:
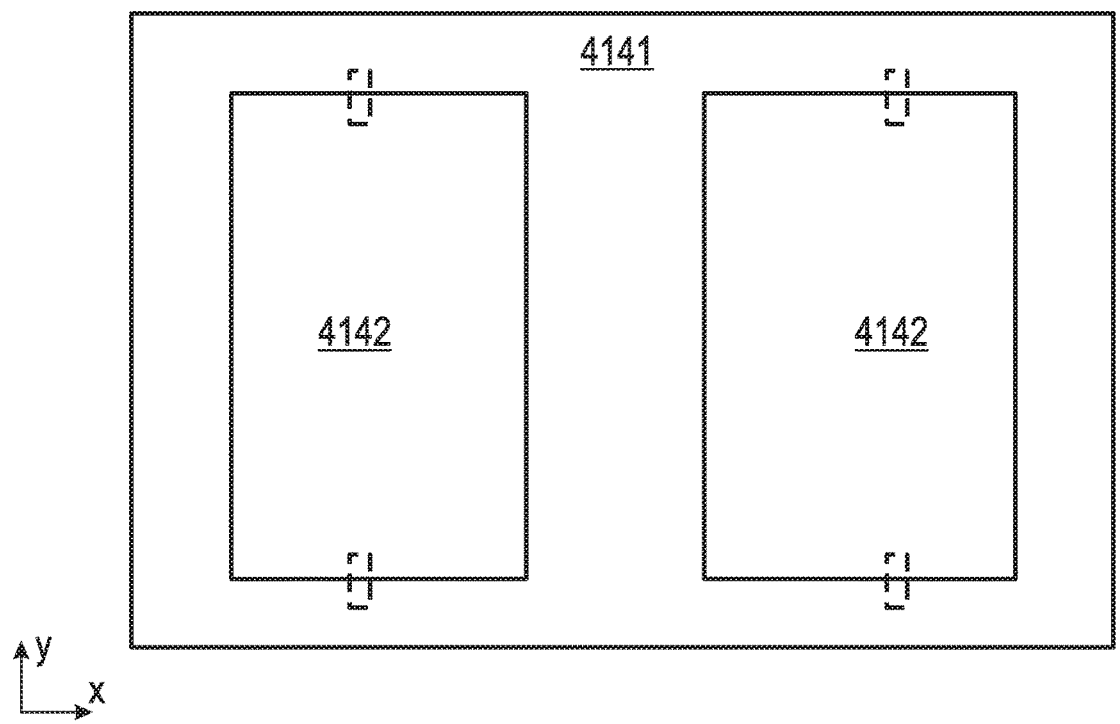
FIG. 4 illustrates a plane view on a semiconductor device having an IGBT cell region and two non-switchable diode regions according to an embodiment described herein.
Figure 5:
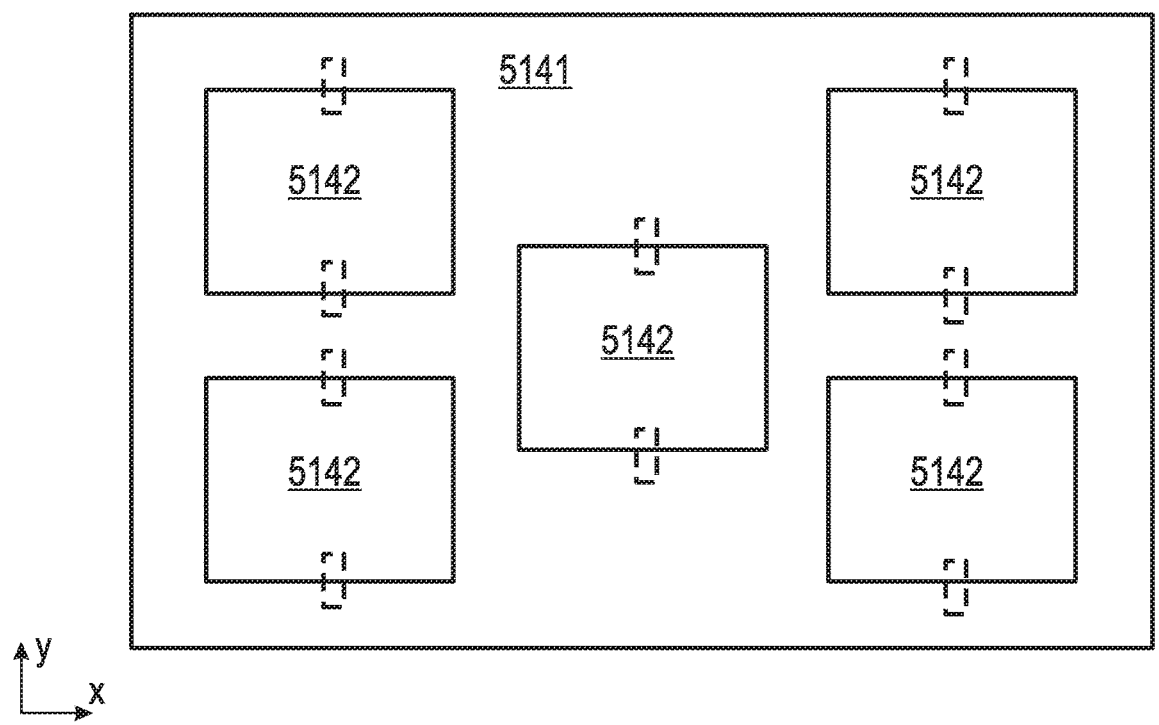
FIG. 5 illustrates a plane view on a semiconductor device having an IGBT cell region and several non-switchable diode regions according to an embodiment described herein.

As illustrated in FIGS. 4 and 5, two free-wheeling diode regions 4142 or more, for example five free-wheeling diode regions 5142 may be used instead of one free-wheeling diode region 2142, and surrounded by one respective IGBT cell region 4141, 5141.

In view of the above, the semiconductor substrate includes, according to an embodiment, a plurality of spaced apart non-switchable free-wheeling diode regions 1141, 4142, 5142 each having a plurality of non-switchable diode cells 142.

The non-switchable free-wheeling diode regions 1141, 4142, 5142 may be substantially equal and/or substantially equally distributed.

However, the free-wheeling diode regions may also have different horizontal extensions and or shapes.

For example, in addition to one larger central free-wheeling diode regions 2142, 3242 as illustrated in FIG. 2 and FIG. 3, respectively, a smaller free-wheeling diode region may be arranged in each of the exemplary four corner regions of the IGBT cell region 2141, 3141.

Further, the lateral distribution of non-switchable free-wheeling diode regions 1141, 4142, 5142, may also be inhomogeneous.

According to a further embodiment (not shown), the semiconductor device has (in plan view) a central or inner IGBT cell region surrounded by a substantially ring-shaped free-wheeling diode region that is surrounded by a substantially ring-shaped outer IGBT cell region.

For reason of sufficiently evenly distributed current, the design of free-wheeling diode and IGBT regions typically has at least one symmetry axis when seen from above.

Figure 6:
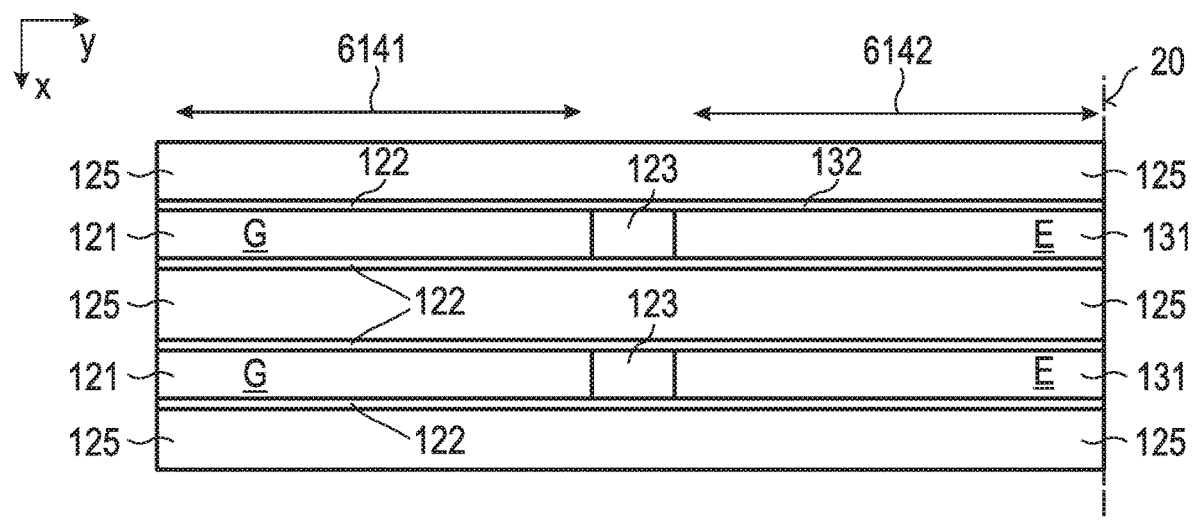
FIG. 6 illustrates a plane view on a semiconductor device having an IGBT cell region and a non-switchable diode region according to an embodiment described herein.

As illustrated in FIG. 6, each of the gate electrodes 121 of the IGBT cell region 6141 may be separated from an adjacent field electrode 131 of an adjacent free-wheeling diode region 6142 by a respective dielectric separator region 132.

Typically, the gate electrodes 121, the adjacent field electrode 131 and the intervening separator region 132 are arranged in a common vertical trench.

Such a separator region 132 may require additional manufacturing processes.

Figure 7:
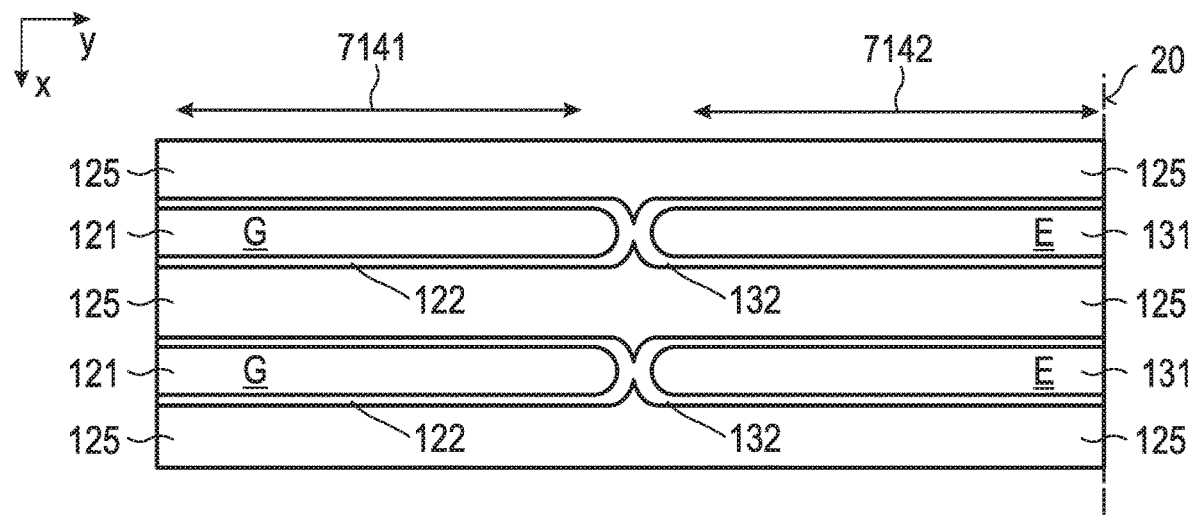
FIG. 7 illustrates a plane view on a semiconductor device having an IGBT cell region and a non-switchable diode region according to an embodiment described herein.

Additional manufacturing processes for the separator region can be saved when the trenches are designed to have respective constrictions in a transitional region between the free-wheeling diode region 7142 and the adjacent IGBT cell region 7141 as illustrated in FIG. 7.

This is because forming the gate dielectrics 122 and the field dielectrics 132 in the trenches, typically using one or more common processes such as thermal oxidation, may results in forming a dielectric barrier in the constrictions.

Figure 8:
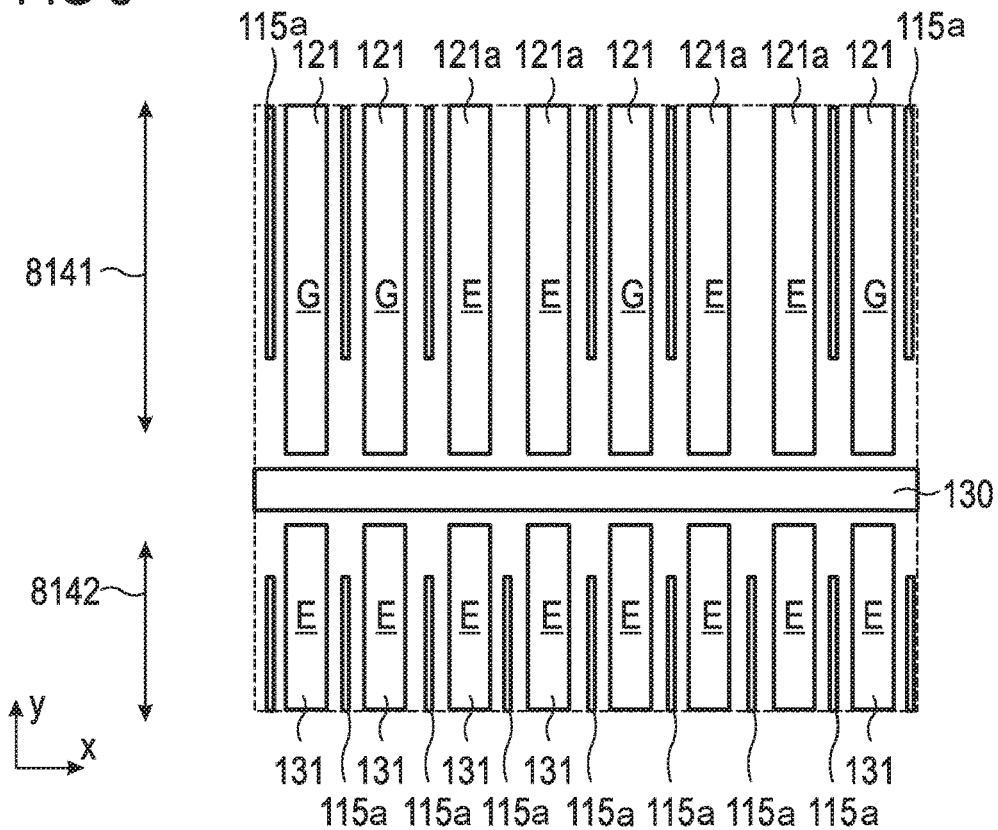
FIG. 8 illustrates a plane view on a semiconductor device having an IGBT cell region and a non-switchable diode region according to an embodiment described herein.

As illustrated in FIG. 8, the free-wheeling diode region 8142 and the adjacent IGBT cell region 8141 may be separated from each other by an additional trench 130.

The additional trench 130 may by substantially ring-shaped and/or surround the free-wheeling diode region 8142 when seen from above.

The additional trench 130 may extend from the front side partly into the drift region 113. The vertical extension of the additional trench 130 may substantially correspond to the vertical extension of the field trenches 120' and or to the vertical extension the gate trenches 120.

Typically, a dielectric layer extending between adjacent gate dielectrics 122 and/or between adjacent field dielectrics 132 is formed at the side wall(s) of the additional trench 130. Accordingly, the body regions 112 of the free-wheeling diode region 8142 are dielectrically separated from the body regions 112 of the IGBT cell region 8141. In the following, the additional trench 130 is also referred to as insulated trench.

The additional trench 130 may be at least substantially filled with a dielectric region.

Alternatively, the additional trench 310 may include an additional electrode which is, similar as the gate and field electrodes 121, 131, separated from the semiconductor substrate by the dielectric layer.

The additional electrode may be floating or in electric contact with the gate metallization and the gate terminal G, respectively.

Further, not all trenches of the IGBT cell region 8141 may include gate electrodes 121 in electric contact with the gate metallization and the gate terminal G, respectively. Instead, dielectrically isolated electrodes 121a may be formed in some of the trenches in a similar manner as the gate electrodes 121, however without connecting the electrodes 121a to the gate metallization and the gate terminal G, respectively, but to the front metallization and the emitter terminal E, respectively. This allows for tuning of the internal input capacitance $C_{GE}$ (capacitance between gate G and emitter E) and the so called gate-drain feedback capacitance $C_{GD}$ (capacitance between gate G and collector C, Miller capacitance) of the IGBT cell region 8141.

Alternatively, at least one of the electrodes 121a may be floating.

Accordingly, the IGBT cell region 8141 may include inactive or dummy cells without any switchable channel region.

Further, the layout of the contact regions 115 may be different n the IGBT cell region and the free-wheeling diode region(s).

Figure 9:
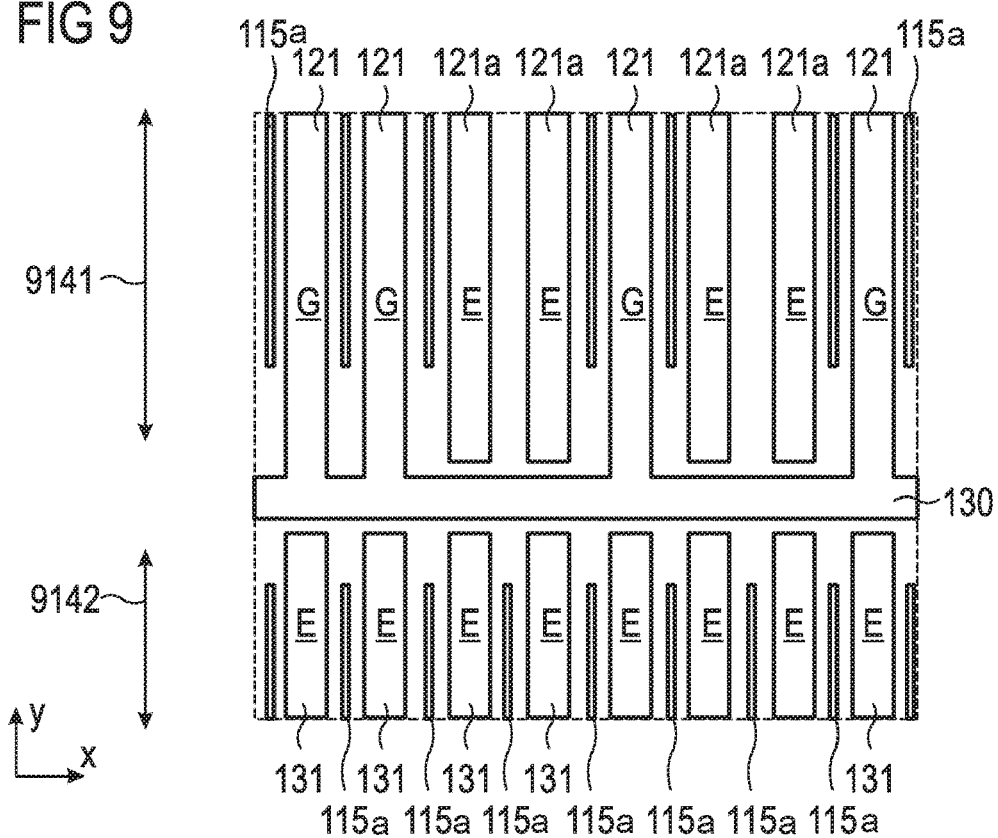
FIG. 9 illustrates a plane view on a semiconductor device having an IGBT cell region and a non-switchable diode region according to an embodiment described herein.

In the embodiments illustrated in FIG. 8 and FIG. 9, all mesas of the free-wheeling diode regions 8142, 9142 are in Ohmic connection with the front metallization 171 via respective contacts 115a typically implemented as shallow trench contacts. Accordingly, the free-wheeling diode regions 8142, 9142 have a particularly large anode area. Different thereto, in IGBT cell regions 8141, 9141, only the mesas that are adjacent to the gate electrodes 121 in Ohmic connection with the gate metallization 171 are in Ohmic connection with the front metallization 171 via respective contacts regions 115 and shallow trench contacts 115a, respectively. Mesas of IGBT cell regions 8141, 9141 which are arranged between dielectrically isolated electrodes 121a do not have contact regions. Accordingly, the drain of holes is hindered and thus the concentration of holes increased during the forward mode resulting in a reduced $V_{CEsat}$.

As illustrated in FIG. 8 and FIG. 9, the contacts 115a are typically substantially stripe-shaped when seen from above.

The contacts 115a may be substantially centered with respect to adjacent electrodes 121, 121a, 131 when seen from above.

Further, each contact 115a of an IGBT cell region 8141, 9141 may be substantially arranged in a virtual extension of one of the contacts 115a of the adjacent free-wheeling diode regions 8142, 9142 when seen from above.

Even further, the contacts 115a are typically spaced apart from the additional trench 30.

Furthermore, the mesas may be in Ohmic connection with the front metallization 171 by more than one respective contact 115a, for example by several contact portions with typical spacing of about 0.5 µm to about 20 µm, more typically in a range from about 1 µm to about 2 µm.

As illustrated in FIG. 9, the gate electrodes 121 may extend into the additional trench 130 and to the electrode formed therein. Accordingly, the gate electrodes 121 may be contacted to a gate pad via a gate runner of the gate metallization from two sites. This reduces the risk of forming undesirably floating gate electrodes due to manufacturing errors at given defect density.

FIGS. 10 to 14 illustrate examples for variation of cells.

FIG. 10 illustrates a cross-sectional view of a non-switchable diode cell 242. A field electrode 131 is formed in the field trench 120' and in electrical contact to the front metallization 171, but not to the gate metallization (173) and the gate terminal G. Thus, the gate voltage applied to the gate terminal G, see FIGS. 1A to 1D, is not supplied to the field electrodes 131 of the non-switchable diode cell 242. Accordingly, the non-switchable diode cell 242 is purely bipolar even if source regions 111 similar as in any of the IGBT cells 141 are formed in non-switchable diode cell 242.

FIG. 11A illustrate an IGBT cell 241 that is similar to the IGBT-cells 141. FIG. 11A also shows an inter-layer dielectric 162 which electrically insulates the front metallization 171, which may form a source or emitter metallization, from the gate metallization 173 in contact with the gate electrode. The IGBT-cells 141 typically have such a contact scheme or a similar contact scheme and an inter-layer dielectric 162 between the front metallization 171 and the gate metallization 173.

Typically, the electric contact between the gate metallization 173 and the gate electrodes 121 is only formed in selective areas, in particular in an edge area of the IGBT cell region. Except for those areas, the gate electrodes 121 may, in vertical cross-sections, be spaced apart from the front metallization 171 by the inter-layer dielectric 162 in the IGBT cell region as illustrated in FIG. 11B.

FIG. 12 illustrates further variations of cell parameters. The non-switchable diode cells 342 of FIG. 12 include an n-barrier 118 or a barrier region 118 below the body region 112 and between the body region 112 and the drift region 113 to reduce the anode efficiency of the body region 112. The n-barrier 118 has a higher doping concentration than the weakly n-doped drift region 113.

In view of the above, according to an embodiment, at least some or all of the non-switchable diode cells can include a barrier region 118 of the first conductivity type arranged between the drift region 113 and the body region 112 or below the pn-junction between the drift region 113 and the body region 112 of the respective non-switchable diode cells 142.

Figure 14:
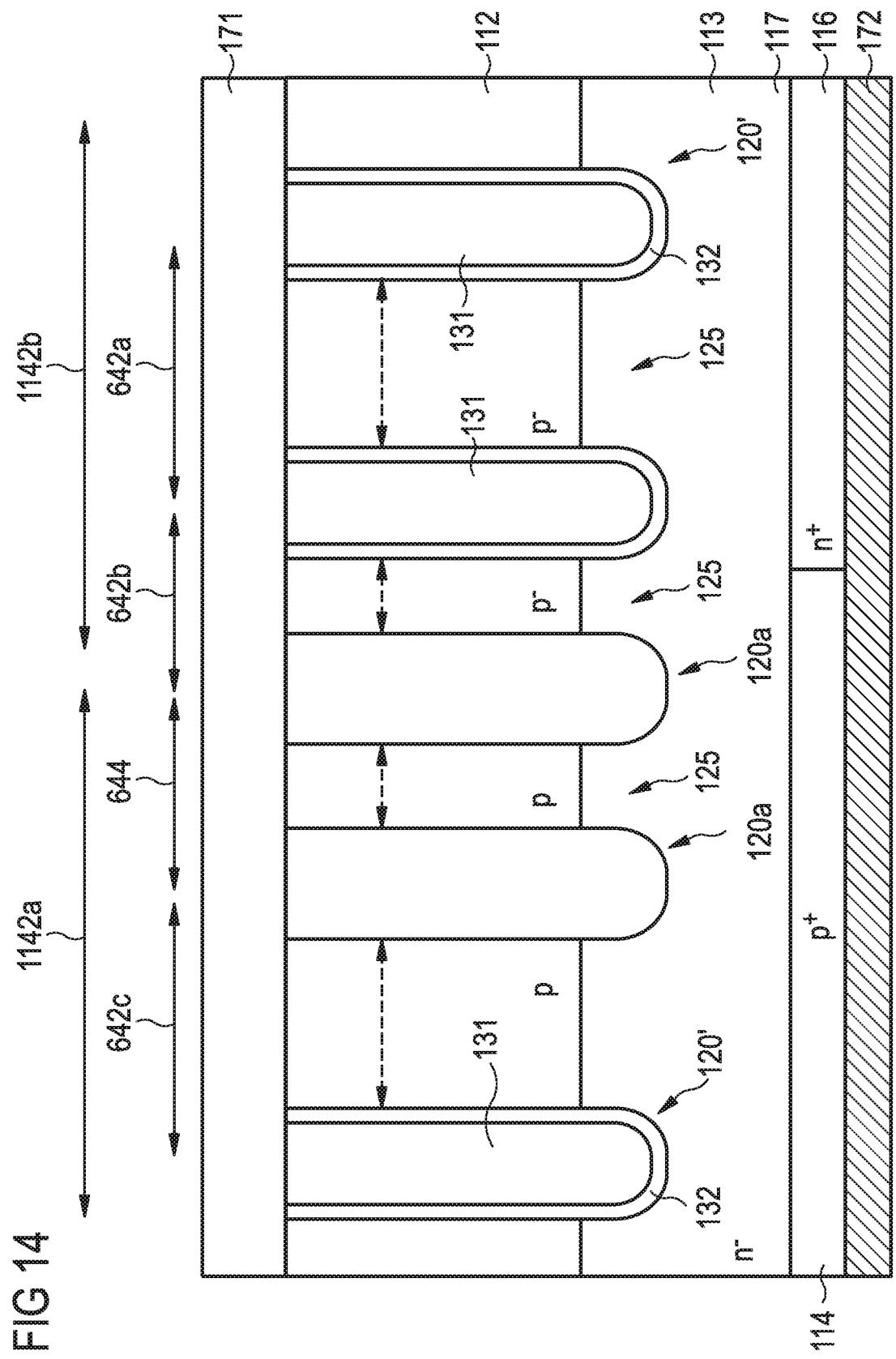
FIG. 14 illustrates a non-switchable diode cell according to an embodiment.

Another option to reduce the anode efficiency is the variation of the doping concentration of the body regions 112. Therefore, according to an embodiment, the body region 112 of at least some or all of the non-switchable diode cells have a doping concentration which is lower than the doping concentration of the body regions 112 of the IGBT cells 142. FIG. 14 illustrates a variation of the anode efficiency.

According to a further embodiment, at least some or all of the non-switchable diode cells are provided with lifetime-controlling dopants and/or crystal defects to reduce the lifetime of charge carriers in comparison to the lifetime of charge carriers in the non-switchable diode cells 142. For example, lifetime-controlling dopants are Pt or Au. Crystal defects for controlling the lifetime of charge carriers can be generated by providing a mask which leaves only regions of the non-switchable diode cells uncovered and then implanting non-doping impurities such as Ar- or Si-ions.

According to an embodiment, at least two of the non-switchable diode cells of the same non-switchable free-wheeling diode region can differ from each other in at least one of the doping concentration of the respective body regions and the concentration of lifetime-controlling dopants. The variations of the doping concentration can be step-wise or gradually.

According to an embodiment, each of the non-switchable diode cells of the first non-switchable free-wheeling diode region has a higher emitter efficiency than each of the non-switchable diode cells of the second non-switchable free-wheeling cell region. This allows for better balancing of current density and thermal loads, respectively, if desired.

The variation of the anode efficiency and the lifetime-control can also be used together and/or in combination with other variations of cell parameters.

According to a further embodiment, at least one non-switchable diode cell 442b of the non-switchable free-wheeling diode region has a barrier region 118, 118a and at least another non-switchable diode cell 442a of the non-switchable free-wheeling diode region has no barrier region.

In a further variation, either in combination or alternatively, at least one non-switchable diode cell 442c of the non-switchable free-wheeling diode region has a barrier region 118b with a different doping concentration than the barrier region 118a of the non-switchable diode cell 442b. Barrier region 118a can have a lower doping concentration than barrier region 118b to form barrier regions of different doping concentrations. The variation of the doping concentration can be step-wise or gradually.

FIG. 12 also illustrates a buffer or field stop layer 117 formed between the drift region 113 and the respective emitter regions 114 and 116.

It is also possible to additionally vary other cell parameters such as the doping concentration of the body regions 112 and/or prevent formation of electrodes in the trenches of the non-switchable diode cells 442 and/or avoid formation of source regions non-switchable diode cells 442.

FIG. 13 illustrates a further variation of cell parameters even between adjacent non-switchable diode cells 542a and 542b. The non-switchable diode cell 542b does not have source regions 111 and body contact regions 115 as non-switchable diode cells 542a. To prevent formation of an operable switchable channel region, the field electrodes 131 are electrically insulated from the gate metallization 173 (not present in this cross-section) by the insulating layer 161.

Furthermore, as illustrated in FIG. 13, at least some of the non-switchable diode cells 542a include a body contact region 115 of the second conductivity embedded in the body region 112 and having a higher doping level than the body region 112, wherein the body contact region 115 forms an Ohmic connection with the front metallization 171.

FIG. 14 illustrates further variations of cell parameters. According to an embodiment, the non-switchable free-wheeling diode region 1142b includes first non-switchable diode cells 642a and second non-switchable diode cells 642b, wherein the electrical connection of the first non-switchable diode cells 642a to the front metallization 171 is different to the electrical connection of the second non-switchable diode cells 642b to the front metallization 171. For example, the contact area between the front metallization 171 and the respective body regions 112 of the first non-switchable diode cells 642a and second non-switchable diode cells 642b within the same non-switchable free-wheeling diode region 1142b can be different (see dashed arrows). This allows optimizing the behavior of the non-switchable free-wheeling diode region 1142b with regard to both the emitter efficiency (small contact area) and dynamic avalanche during switching-off commutation (large contact area). Alternatively or in addition to that, body contact regions 115 can be selectively formed.

The contact area between the front metallization 171 and the respective body regions 112 can also be varied between different and spaced apart non-switchable free-wheeling diode regions 1142a and 1142b.

As also illustrate in FIG. 14, according to an embodiment, at least a portion of a first non-switchable free-wheeling diode region 1142a is arranged above the emitter region 114 of the second conductivity type formed at the second side of the semiconductor substrate 100, and at least a portion of or all of a second non-switchable free-wheeling diode region 1142b is arranged above the emitter region 116 of the first conductivity type formed at the second side of the semiconductor substrate 100. A portion of the non-switchable free-wheeling diode region can be formed above the p-type emitter region 114 above which also the IGBT cell region is exclusively formed.

The non-switchable diode cells 642c of the non-switchable free-wheeling diode region 1142a, which are arranged above the p-doped emitter region 114, can be provided with a high emitter efficiency, which can be higher than the emitter efficiency of non-switchable diode cells 642a, 642 of the same or different non-switchable free-wheeling diode regions 1142b which are arranged above the n-doped emitter region 116. The increased emitter efficiency allows adjustment of the diode commutation after desaturating pulses. Desaturating pulses are applied during the above mentioned transit mode where the conductive channels 151 are rendered conductive for a short period.

The portion of the non-switchable free-wheeling diode region arranged above the emitter region of the second conductivity type, in the embodiment of FIG. 14 the non-switchable free-wheeling diode region 1142a above the p-doped emitter region 114, contributes to the diode commutation after desaturation. The portion of the non-switchable free-wheeling diode region arranged above the emitter region of the second conductivity type can be provided with a higher emitter efficiency than portions of the non-switchable free-wheeling diode region or other non-switchable free-wheeling diode regions which are arranged above the emitter region of the first conductivity type. The different emitter efficiency can be adjusted by, for example, variation of the doping concentration of the respective body regions 112 or the contact area between the respective body regions 112 and the front metallization 171 as described above.

FIG. 14 also illustrates that a dummy cell 644 with two exemplary dielectrically filled trenches 120a can be integrated in the non-switchable free-wheeling diode region 1142a or in any other non-switchable free-wheeling diode region (or any IGBT cell region).

According to an embodiment, a semiconductor device includes a semiconductor substrate having a front side, a front metallization arranged on the front side, a back metallization opposite the front metallization, a gate metallization, at least one IGBT cell region, and at least one free-wheeling (cell) diode region. The at least one IGBT cell region includes a plurality of IGBT cells at least partly integrated in the semiconductor substrate. Each of the IGBT cells includes a gate electrode arranged adjacent to and electrically insulated from the semiconductor substrate to define an operable switchable channel region for providing an Ohmic connection between the front metallization and a drift region of the semiconductor substrate. The at least one free-wheeling diode region includes a plurality of diode cells integrated in the semiconductor substrate. Each of the diode cells includes a pn-junction arranged between the front metallization and the back metallization, and extending between two adjacent field-dielectrics of respective field electrode structures. Each of the field-electrode structures further includes a field-electrode which is not in Ohmic connection with the gate metallization and separated from the semiconductor substrate by the respective field-dielectric. When seen in a normal projection onto a horizontal plane parallel to the front side, the gate electrodes and the field-electrodes are a least substantially stripe-shaped, and the gate electrodes and the field-electrodes are pairwise substantially centered with respect to a (central) longitudinal axis of the respective the field-electrode.

To reduce the influence of the switchable channel regions while allowing the gate voltage to be applied during reverse conductive mode, free-wheeling diode region is typically formed by the non-switchable diode cells which do not include any operable switchable channel region so that there is a sufficient minimum lateral safety distance to the next operable switchable channel region in the IGBT cell region. Even if non-switchable diode cells arranged at the periphery of the non-switchable free-wheeling diode region are affected, and thus could be inactivated, by the action of the operable switchable channel region of any of the IGBT cells arranged next to the non-switchable free-wheeling diode region, non-switchable diode cells in the center of the non-switchable free-wheeling diode region remain unaffected. These "central" non-switchable diode cells can function as "normal" free-wheeling diode so that no snapping-back occurs or is negligible.

The larger the above mentioned geometric safety distance or specific safety distance (taking into account specific resistance and doping levels, respectively) to the IGBT cell region is, the more non-switchable diode cells remain safely unaffected by the action of the switchable channel regions of the IGBT cells.

Due to arranging the gate electrodes in respective virtual extension of the field electrodes, the safety distance and thus the required chip area can be reduced without affecting the device operation.

Typically, at least a few of the field electrodes are in Ohmic contact with the front metallization. Accordingly any influence of the gate electrodes onto the operation of the free-wheeling diode region is further reduced.

According to an embodiment of a method of manufacturing a semiconductor device, the method includes providing a semiconductor substrate, typically a wafer, having a front side and a back side opposite the front side, and including a drift layer and a body layer arranged between the front side and the drift layer, and forming a pn-junction with the drift layer; and defining an IGBT cell region and a free-wheeling diode region adjacent to IGBT cell region. Next to the front side, a trench gate electrode electrically insulated from the semiconductor substrate is formed in the IGBT cell region, and a trench field electrode separated from the semiconductor substrate is formed in the free-wheeling diode region. A front metallization is formed on the front side and in Ohmic connection with the body layer and typically also with the trench gate electrode. A gate metallization is formed in Ohmic connection with the trench gate electrode. A back metallization is formed on the back side and in Ohmic connection with the drift layer. The method is performed so that the gate electrode is arranged in a first trench extending through the body layer when seen in a first vertical cross-section perpendicular to the first side, that the field electrode is arranged in a second trench extending through the body layer when seen in a second vertical cross-section parallel to and spaced apart from the first vertical cross-section, that the field electrode is substantially shaped as a second stripe when seen in a normal projection onto a horizontal plane parallel to the front side, and that the gate electrode is substantially shaped as a first stripe arranged in a virtual extension of the second stripe when seen in the normal projection onto the horizontal plane.

The method is typically performed so that the IGBT cell region includes a plurality of substantially bar-shaped or substantially plate-shaped trench gate electrodes and that the free-wheeling diode region includes a plurality of substantially bar-shaped or substantially plate-shaped trench field electrodes arranged at substantially the same pitch as the trench gate electrodes.

Forming the trench gate electrode(s) and forming the trench field electrode(s) typically include at least one of the following common processes: masked etching of trench(es) from the front side and partly into the body layer, forming a dielectric layer at side and bottom walls of the trench(es), for example by thermal oxidation and/or deposition, and, thereafter, filling the trench(es) with a conductive material such as (highly) doped poly-silicon. Accordingly, manufacturing is facilitated.

Further, method is typically performed so that the field electrodes and the gate electrodes have the same width (in x-direction) and or the same vertical extension (z-direction).

With the above range of variations and applications in mind, it should be understood that the present invention is not limited by the foregoing description, nor is it limited by the accompanying drawings. Instead, the present invention is limited only by the following claims and their legal equivalents.

REFERENCE LIST 100 semiconductor substrate
101 first or main surface or side
102 second or bottom surface or side
111 source region
112 body region
112a weakly doped body region of non-switchable diode cell
113 drift region
114 emitter region of second conductivity type
115 body contact region
115a contact
116 emitter region of first conductivity type
117 buffer or field stop layer
118 n-barrier/barrier region
120, 120' trench
120a trench
121 gate electrode
122 gate dielectric
125 mesa region
130 additional trench
131 field electrode
141 IGBT cell
142, 142a, 142b, 142c, 142d non-switchable diode cell
242, 342, 442, non-switchable diode cell
442a, 442b, 442c non-switchable diode cell
542a, 542b non-switchable diode cell
151 switchable channel region
162 inter-layer dielectric
171 front metallization
172 back metallization
173 gate metallization
642a first non-switchable diode cell
642b second non-switchable diode cell
642c non-switchable diode cell with high emitter efficiency
644 dummy cell
1141-9141 IGBT cell region
1142, 1142a, 1142b-9142 non-switchable freewheeling diode cell region
G gate terminal
E emitter terminal
C collector terminal
$V_{CE}$ emitter-collector voltage

What is claimed is:

1. A semiconductor device, comprising:
    a semiconductor substrate comprising a front side, a back side opposite the front side, a drift layer, and a body layer arranged between the front side and the drift layer and forming a pn-junction with the drift layer;
    a front metallization arranged on the front side and in Ohmic connection with the body layer;
    a gate metallization;
    an IGBT cell region comprising gate electrodes in Ohmic connection with the gate metallization, and electrically insulated from the semiconductor substrate; and
    a free-wheeling diode region adjacent to the IGBT cell region and comprising field electrodes in Ohmic connection with the front metallization, and separated from the semiconductor substrate and the gate electrode,
    wherein the gate electrodes are arranged in respective first trenches extending through the body layer in a first vertical cross-section perpendicular to the front side,
    wherein the field electrodes are arranged in respective second trenches extending through the body layer in a second vertical cross-section parallel to and spaced apart from the first vertical cross-section,
    wherein in a normal projection onto a horizontal plane parallel to the front side, the field electrodes are substantially shaped as second stripes, and the gate electrodes are substantially shaped as first stripes arranged in a virtual extension of the second stripes,
    wherein the gate electrodes extend into an additional trench and are connected to one another by an electrode formed in the additional trench,
    wherein the additional trench extends longitudinal in a direction which is transverse to a longitudinal direction of the first trenches and of the second trenches,
    wherein the free-wheeling diode region and the adjacent IGBT cell region are separated from each other by the additional trench.

2. The semiconductor device of claim 1, wherein the free-wheeling diode region is devoid of operable switchable channel regions.

3. The semiconductor device of claim 1, wherein the field electrodes in the free-wheeling diode region are first field electrodes and wherein the semiconductor device further comprises second field electrodes arranged in respective third trenches extending through the body layer in the first vertical cross-section parallel to the first trenches, wherein two or more field electrodes in the third trenches are arranged between two adjacent gate electrodes in the first trenches.

4. The semiconductor device of claim 3, wherein the field electrodes in the free-wheeling diode region are interleaved with contacts, and wherein the two or more field electrodes in the third trenches arranged between two adjacent gate electrodes in the first trenches are not interleaved with contacts.

5. The semiconductor device of claim 1, wherein the field electrodes in the free-wheeling diode region are interleaved with contacts, and wherein a distance between the second trenches and the additional trench is equal to or shorter than the distance between the contacts and the additional trench in a direction parallel to the second trenches.

6. A semiconductor device, comprising:
    a semiconductor substrate comprising a front side, a back side, a drift layer, and a body layer arranged between the front side and the drift layer and forming a pn-junction with the drift layer;
    a front metallization arranged on the front side and in Ohmic connection with the body layer;
    a gate metallization;
    an IGBT cell region comprising a plurality of gate electrodes in Ohmic connection with the gate metallization, each gate electrode being electrically insulated from the semiconductor substrate by a respective gate dielectric extending through the body layer; and
    a free-wheeling diode region adjacent to the IGBT cell region and comprising a plurality of field electrodes in Ohmic connection with the front metallization, each field electrode being separated from the semiconductor substrate by a respective field dielectric extending through the body layer, wherein in a normal projection onto a horizontal plane parallel to the front side, the gate electrodes form a pattern of substantially parallel first stripes, and the field-electrodes form a pattern of substantially parallel second stripes, wherein at least one of the second stripes runs towards one of the first stripes, wherein the gate electrodes extend into an additional trench and are connected to one another by an electrode formed in the additional trench, wherein the additional trench extends longitudinal in a direction which is transverse to a longitudinal direction of the gate electrodes and of the field-electrodes, wherein the free-wheeling diode region and the adjacent IGBT cell region are separated from each other by the additional trench.

7. The semiconductor device of claim 6, further comprising several electrode pairs each of which is formed by:
one of the field-electrodes extending along a horizontally orientated central longitudinal axis; and
an adjacent but spaced apart one of the gate electrodes at least substantially extending along the central longitudinal axis of the respective field-electrode.

8. The semiconductor device of claim 6, wherein the field electrodes in the free-wheeling diode region are first field electrodes and wherein the semiconductor device further comprises second field electrodes arranged in respective third trenches extending through the body layer in the first vertical cross-section parallel to the first trenches, wherein two or more field electrodes in the third trenches are arranged between two adjacent gate electrodes in the first trenches.

9. The semiconductor device of claim 8, wherein the field electrodes in the free-wheeling diode region are interleaved with contacts, and wherein the two or more field electrodes in the third trenches arranged between two adjacent gate electrodes in the first trenches are not interleaved with contacts.

10. The semiconductor device of claim 6, wherein the field electrodes in the free-wheeling diode region are interleaved with contacts, and wherein a distance between the second trenches and the additional trench is equal to or shorter than the distance between the contacts and the additional trench in a direction parallel to the second trenches.

11. The semiconductor device of claim 6, wherein the free-wheeling diode region is a non-switchable bipolar diode region and/or comprises a plurality of non-switchable bipolar diode cells, and wherein the plurality of non-switchable bipolar diode cells include a barrier region below the body layer and between the body layer and the drift layer, the barrier region configured to reduce anode efficiency of the body layer.

12. The semiconductor device of claim 11, wherein the barrier region has a higher doping concentration than the drift layer.

13. The semiconductor device of claim 6, wherein the free-wheeling diode region is devoid of operable switchable channel regions.

14. The semiconductor device of claim 6, wherein the first stripes are substantially parallel to the second stripes, and/or wherein pairs of the first and second stripes are at least substantially centered with respect to each other.

15. The semiconductor device of claim 6, wherein the free-wheeling diode region is, in the normal projection onto the horizontal plane, substantially shaped as a rectangle or a cross.

16. The semiconductor device of claim 6, wherein the IGBT cell region surrounds the free-wheeling diode region in the normal projection onto the horizontal plane.

17. The semiconductor device of claim 6, further comprising an insulated trench arranged between the IGBT cell region and the free-wheeling diode region.

18. The semiconductor device of claim 17, wherein the insulated trench is substantially stripe-shaped and orientated substantially perpendicular to at least one of the first stripes and the second stripes in the normal projection onto the horizontal plane, wherein the insulated trench comprises a dielectric layer formed at least at a sidewall of the insulated trench, and/or wherein the insulated trench extends through the body layer and/or partly into the drift layer.

19. The semiconductor device of claim 17, wherein the insulated trench comprises an electrode insulated from the semiconductor substrate, and/or wherein at least one of the gate electrodes extends to the electrode.

20. The semiconductor device of claim 6, wherein the IGBT cell region comprises a dummy cell.

21. The semiconductor device of claim 6, wherein the semiconductor device is implemented as a power semiconductor device, wherein a ratio between a distance between the gate electrodes and the field electrodes and a distance between adjacent field electrodes is in a range between about 0.25 to about 5, and/or wherein the semiconductor device further comprises next to the front side an edge-termination structure surrounding the IGBT cell region.

22. The semiconductor device of claim 6, wherein the semiconductor device is devoid of a switchable free-wheeling diode region integrated in the semiconductor device.

* * * * *